(12) United States Patent
Kaneta et al.

(10) Patent No.: US 9,297,876 B2
(45) Date of Patent: Mar. 29, 2016

(54) MAGNETIC RESONANCE IMAGING APPARATUS AND EDDY CURRENT COMPENSATION METHOD

(75) Inventors: Akiko Kaneta, Tokyo (JP); Hiroyuki Takeuchi, Tokyo (JP); Shouichi Miyawaki, Tokyo (JP)

(73) Assignee: HITACHI MEDICAL CORPORATION, Tokyo (JP)

( * ) Notice: Subject to any disclaimer, the term of this patent is extended or adjusted under 35 U.S.C. 154(b) by 1105 days.

(21) Appl. No.: 13/377,275

(22) PCT Filed: Jun. 4, 2010

(86) PCT No.: PCT/JP2010/059501
§ 371 (c)(1),
(2), (4) Date: Jan. 6, 2012

(87) PCT Pub. No.: WO2010/143586
PCT Pub. Date: Dec. 16, 2010

(65) Prior Publication Data
US 2012/0098535 A1 Apr. 26, 2012

(30) Foreign Application Priority Data
Jun. 10, 2009 (JP) .................................. 2009-138785

(51) Int. Cl.
*G01R 33/58* (2006.01)
*G01R 33/38* (2006.01)
*G01R 33/565* (2006.01)

(52) U.S. Cl.
CPC ................ *G01R 33/56518* (2013.01)

(58) Field of Classification Search
CPC .................. G01R 33/56518; G01R 33/565
USPC ........................ 324/300–322; 600/407–420
See application file for complete search history.

(56) References Cited

U.S. PATENT DOCUMENTS

| 5,742,164 A * | 4/1998 | Roemer et al. ............. 324/318 |
| 7,323,872 B1 * | 1/2008 | Takahashi et al. .......... 324/309 |
| 2005/0218894 A1 | 10/2005 | Miyawaki et al. |
| 2006/0022674 A1 * | 2/2006 | Zhou et al. ................. 324/309 |

(Continued)

FOREIGN PATENT DOCUMENTS

| JP | 10-272120 | 10/1998 |
| JP | 2003-111744 | 4/2003 |

(Continued)

OTHER PUBLICATIONS

English translation of JP 2005-288026.*
International Search Report in PCT/JP2010/059501.

*Primary Examiner* — Melissa Koval
*Assistant Examiner* — Rishi Patel
(74) *Attorney, Agent, or Firm* — Cooper & Dunham LLP

(57) ABSTRACT

An object is to correct a magnetic field caused by an eddy current, which is generated due to application of a gradient magnetic field, not only in the application direction of the gradient magnetic field but also in a direction different from the application direction of the gradient magnetic field. In the present invention, in order to achieve this object, a compensation magnetic field which compensates for an eddy current magnetic field generated in each of an application direction of a test gradient magnetic field and a direction different from the application direction in each direction is calculated using the test gradient magnetic field. When generating an arbitrary gradient magnetic field, a compensation magnetic field which compensates for an eddy current magnetic field according to application of an arbitrary gradient magnetic field on the basis of the measured eddy current magnetic field in each direction is generated together with the arbitrary gradient magnetic field.

13 Claims, 14 Drawing Sheets

(56) References Cited

U.S. PATENT DOCUMENTS

| | | |
|---|---|---|
| 2009/0212772 A1* | 8/2009 | Ookawa .................. 324/309 |
| 2010/0244822 A1* | 9/2010 | Yu et al. ................. 324/307 |
| 2011/0064294 A1* | 3/2011 | Abe ................ A61B 5/02007 382/131 |

FOREIGN PATENT DOCUMENTS

| | | |
|---|---|---|
| JP | 2005-288026 | 10/2005 |
| JP | 2006-102541 | 4/2006 |
| WO | WO2004/004563 A1 | 1/2004 |

* cited by examiner

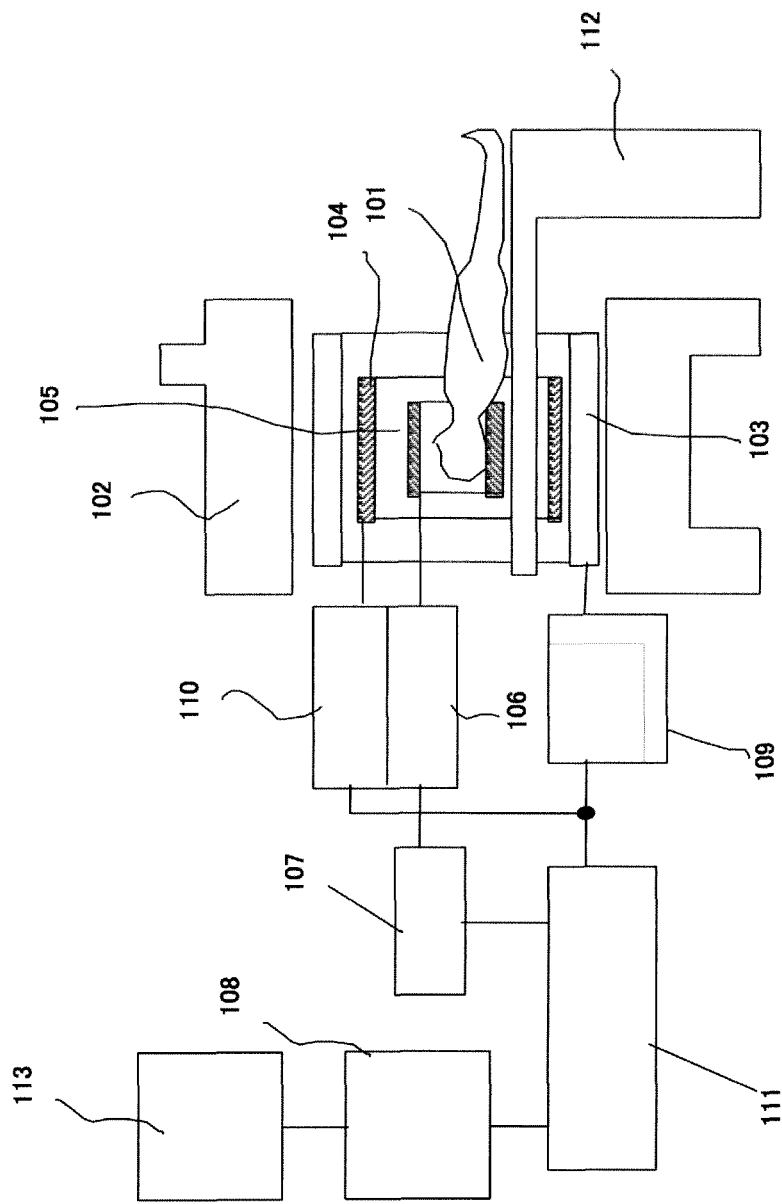

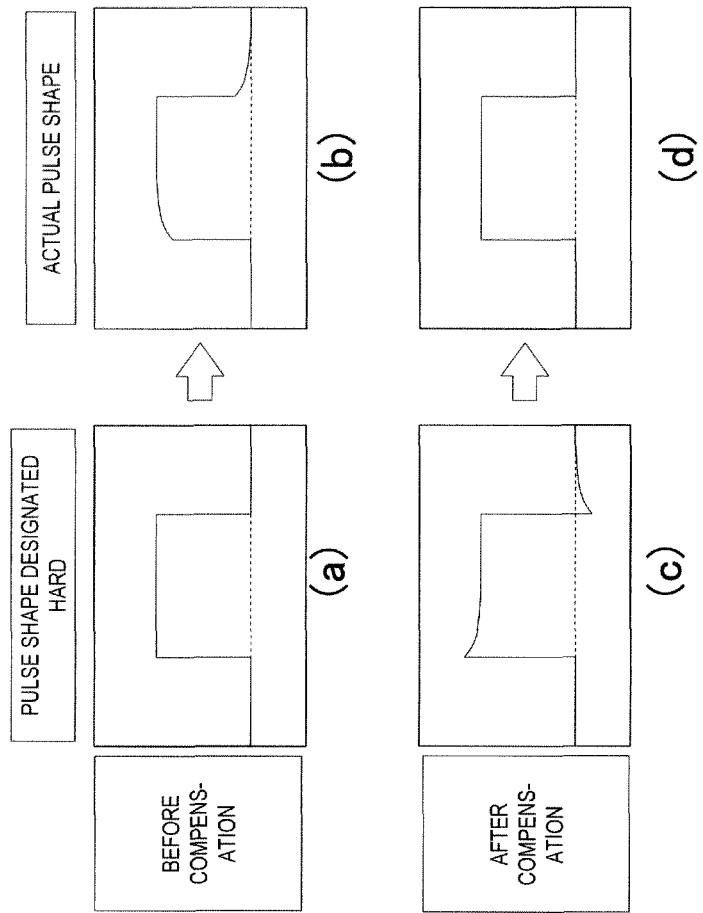

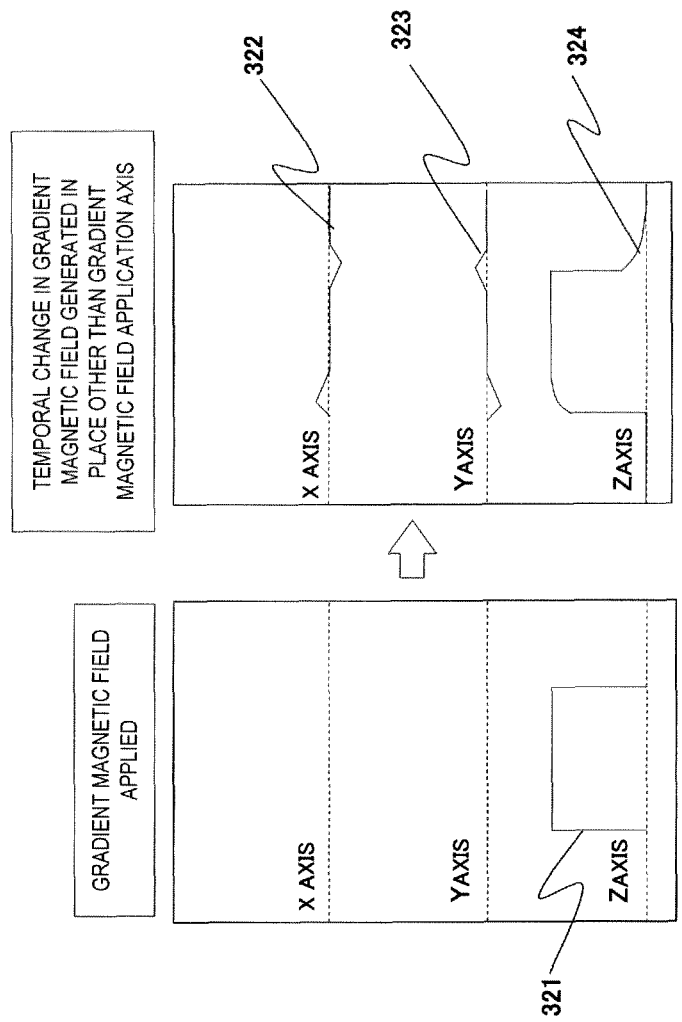

MAGNETIC RESONANCE IMAGING APPARATUS AND EDDY CURRENT COMPENSATION METHOD

TECHNICAL FIELD

The present invention relates to a technique of compensating the influence of an eddy current, which is generated on the basis of application of a gradient magnetic field, in a magnetic resonance imaging (hereinafter, referred to as an "MRI") apparatus.

BACKGROUND ART

An MRI apparatus is an apparatus which measures a nuclear magnetic resonance (hereinafter, referred to as NMR) signal generated by the subject, especially, the nuclear spins which form human tissue and images the shapes or functions of the head, abdomen, limbs, and the like in a two-dimensional manner or in a three-dimensional manner. In the imaging, different phase encoding and different frequency encoding are given to NMR signals by the gradient magnetic field, and the NMR signals are measured as time series data. The measured NMR signals are reconstructed as an image by a two-dimensional or three-dimensional Fourier transform.

In order to perform imaging with the MRI apparatus, it is necessary to use a gradient magnetic field changing with time as described above. The application time and the strength of the gradient magnetic field need to be accurately controlled in order to correctly select an imaging region or correctly give the positional information to an NMR signal. However, a damping current (so-called eddy current) is induced in various structures around the gradient coil due to application of the gradient magnetic field, and this eddy current generates a magnetic field which changes spatially and temporally. When the magnetic field caused by the eddy current reaches an imaging region of a subject together with the gradient magnetic field, the application time and the strength of the gradient magnetic field applied to the nuclear spins in the imaging region deviate from the desired application time and strength. As a result, it becomes impossible to correctly select an imaging region or correctly give the positional information to an NMR signal, and this causes image quality degradation, such as image distortion, a reduction in signal strength, and the occurrence of ghosting.

Therefore, PTL 1 discloses a method of suppressing the image quality degradation due to an eddy current by measuring a magnetic field induced by the eddy current and applying a compensation magnetic field for negating the magnetic field using a shim coil. Specifically, test gradient magnetic fields are applied using two test gradient magnetic fields with different polarities, and then a high-frequency magnetic field pulse and a phase encoding gradient magnetic field are applied to a phantom to measure a free induction damping signal (FID signal). Phase information included in two FID signals acquired is influenced by the magnetic field caused by the eddy current, the phase encoding gradient magnetic field, and the unevenness of the static magnetic field. Therefore, by taking a difference in phase information obtained by a Fourier transform of the two FID signals measured by applying the test gradient magnetic fields with different polarities, the influence by the phase encoding gradient magnetic field and the unevenness of the static magnetic field is eliminated. As a result, a phase difference image representing the influence of the magnetic field due to the eddy current generated due to the test gradient magnetic field is obtained. On the basis of this phase difference image, the spatial distribution and the temporal change of the magnetic field caused by the eddy current are calculated, and the distribution and size of a compensation magnetic field are determined.

CITATION LIST

Patent Literature

[PTL 1] International Publication No. WO2004/004563

SUMMARY OF INVENTION

Technical Problem

The method of calculating an eddy current magnetic field generated due to an eddy current from the phase information of signals measured as in PTL 1 is a method of measuring an eddy current magnetic field generated in a direction in which a gradient magnetic field is applied. In practice, however, the eddy current magnetic field generated due to the eddy current is induced not only in the application direction of the gradient magnetic field but also in a direction (hereinafter, referred to as a cross term) perpendicular to the application direction. In the method disclosed in PTL 1, since the cross term is not taken into consideration, it is not possible to measure the magnetic field in the direction perpendicular to the application direction of the gradient magnetic field. Accordingly, it is not possible to negate these cross terms by a compensation magnetic field or to correct the cross terms at the time of image reconstruction either.

Therefore, the present invention has been made in view of the above-described problems, and an MRI apparatus and an eddy current compensation method capable of correcting a magnetic field caused by an eddy current, which is generated due to application of a gradient magnetic field, not only in the application direction of the gradient magnetic field but also in a direction different from the application direction of the gradient magnetic field are provided.

Solution to Problem

In order to achieve the above-described object, in the present invention, a compensation magnetic field, which compensates for an eddy current magnetic field generated in each of an application direction of a test gradient magnetic field and a direction different from the application direction in each direction, is calculated using the test gradient magnetic field. When generating an arbitrary gradient magnetic field, a compensation magnetic field, which compensates for an eddy current magnetic field according to application of an arbitrary gradient magnetic field on the basis of the measured eddy current magnetic field in each direction, is generated together with the arbitrary gradient magnetic field.

Specifically, an MRI apparatus of the present invention includes a gradient magnetic field generating unit that generates an arbitrary gradient magnetic field and is characterized in that an eddy current magnetic field based on an eddy current, which is generated according to application of a test gradient magnetic field, is measured in an application direction of the test gradient magnetic field and a direction different from the application direction through a phase of an image, a compensation magnetic field calculating unit calculates a compensation magnetic field, which is for compensating for an eddy current magnetic field according to application of the arbitrary gradient magnetic field in each direction, on the basis of the measured eddy current magnetic field in each direction, and the gradient magnetic field generating unit generates the calculated compensation magnetic field in each direction together with the arbitrary gradient magnetic field.

In addition, an eddy current compensation method of the present invention is characterized in that it includes: an eddy current magnetic field measuring step of measuring an eddy current magnetic field, which is generated in each of an application direction of a test gradient magnetic field and a direction different from the application direction, through a phase of an image; a compensation magnetic field calculation step of calculating a compensation magnetic field, which compensates for an eddy current magnetic field according to application of an arbitrary gradient magnetic field in each direction, on the basis of the measured eddy current magnetic field in each direction; and a compensation magnetic field generating step of generating the calculated compensation magnetic field in each direction together with the arbitrary gradient magnetic field.

Advantageous Effects of Invention

As described above, the MRI apparatus and the eddy current compensation method of the present invention can measure a magnetic field, which is caused by an eddy current generated due to a gradient magnetic field, not only in the application direction of the gradient magnetic field but also including a cross term. Using this measurement result, a magnetic field caused by an eddy current generated due to application of a gradient magnetic field can be corrected not only in the application direction of the gradient magnetic field but also in a direction different from the application direction of the gradient magnetic field. As a result, the quality of an image is improved.

BRIEF DESCRIPTION OF DRAWINGS

FIG. 1 is a block diagram showing the entire configuration of an example of an MRI apparatus according to the present invention.

FIG. 2 is a schematic view of compensation for an eddy current magnetic field of a gradient magnetic field pulse. FIG. 2 shows the relationship between an output example of a gradient magnetic field waveform from a measurement control unit, which is shown at the left side (FIGS. 2(a) and 2(c)), and a gradient magnetic field waveform actually applied to an imaging region of a subject, which is shown at the right side (FIGS. 2(b) and 2(d)). A case where a compensation magnetic field is not generated is shown at the upper side (FIGS. 2(a) and 2(b)), and a case where a compensation magnetic field is generated is shown at the lower side (FIGS. 2(c) and 2(d)).

FIG. 3C is a view showing a gradient magnetic field waveform actually applied to an imaging region of a subject when a gradient magnetic field with a rectangular waveform is output from a gradient coil only in the Z-axis direction.

FIG. 6(a) is an operation flow for acquiring calibration data using a calibration pulse sequence, and FIG. 6(b) is a processing flow of the acquired calibration data.

FIG. 7(a) shows pairs of slice positions which are symmetrical with respect to the origin or the XY plane, are separated by a predetermined distance in the Z-axis direction, and are parallel to the XY plane, FIG. 7(b) shows pairs of slice positions parallel to the YZ plane, and FIG. 7(c) shows pairs of slice positions parallel to the ZX plane.

DESCRIPTION OF EMBODIMENTS

Figure 3A:
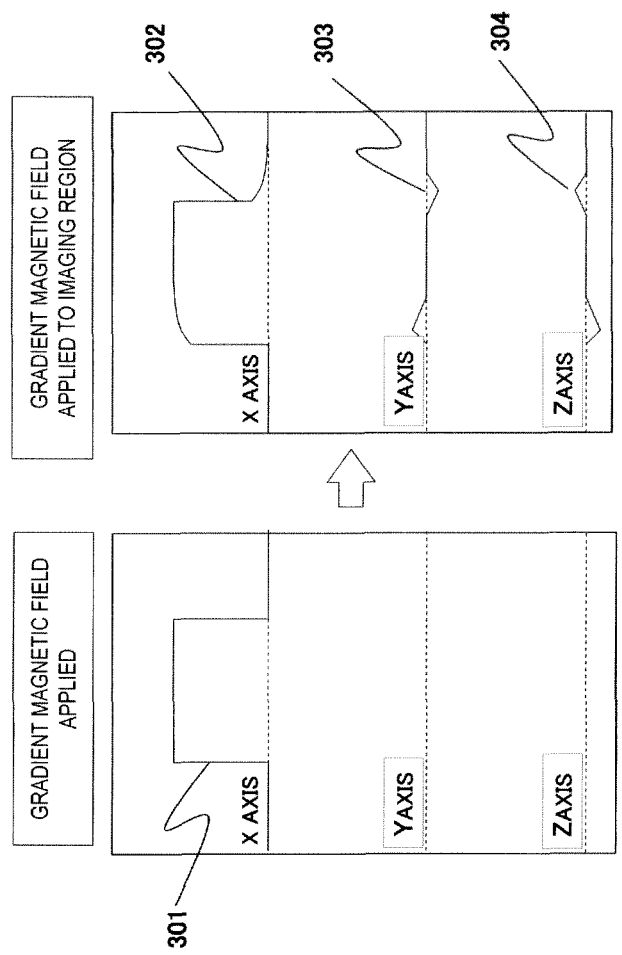
FIG. 3A is a view showing a gradient magnetic field waveform actually applied to an imaging region of a subject when a gradient magnetic field with a rectangular waveform is output from a gradient coil only in the X-axis direction.

Hereinafter, preferred embodiments of an MRI apparatus of the present invention will be described in detail according to the accompanying drawings. In addition, in all drawings for explaining the embodiments of the present invention, the same reference numeral is given to those with the same function and repeated explanation thereof will be omitted.

First, the outline of an example of an MRI apparatus related to the present invention will be described on the basis of FIG. 1. FIG. 1 is a block diagram showing the entire configuration of an example of the MRI apparatus related to the present invention. This MRI apparatus acquires a tomographic image of a subject 101 using an NMR phenomenon. As shown in FIG. 1, the MRI apparatus is configured to include a static magnetic field generation magnet 102, a gradient coil 103 and a gradient magnetic field power source 109, a transmission RF coil 104 and an RF transmission unit 110, a receiving RF coil 105 and a signal detection unit 106, a signal processing unit 107, a measurement control unit 111, an overall control unit 108, a display and operation unit 113, and a bed 112 on which the subject 101 is carried and which takes the subject 101 to the inside of the static magnetic field generation magnet 102.

The static magnetic field generation magnet 102 generates a uniform static magnetic field in a direction perpendicular to the body axis of the subject 101 in the case of a vertical magnetic field method and in the body axis direction in the case of a horizontal magnetic field method. A permanent magnet type, a normal conducting type, or a superconducting type static magnetic field generator is disposed around the subject 101. Moreover, in the static magnetic field generation magnet 102, a shim coil or a shim member is disposed in order to correct the unevenness.

The gradient coil 103 is a coil wound in three axial directions of X, Y, and Z, which are the coordinate system (stationary coordinate system) of the MRI apparatus, and each gradient coil is connected to the gradient magnetic field power source 109 which drives it so that a current is supplied thereto. Specifically, the gradient magnetic field power source 109 of each gradient coil is driven according to a command from the measurement control unit 111, which will be described later, and supplies a current to each gradient coil. Then, the gradient magnetic fields Gx, Gy, and Gz are generated in the three axial directions of X, Y, and Z. At the time of imaging, a slice gradient magnetic field pulse (Gs) is applied in a direction perpendicular to the slice surface (cross section of imaging) so that a slice surface of the subject 101 is set, and a phase encoding gradient magnetic field pulse (Gp) and a frequency encoding gradient magnetic field pulse (Gf) are applied in the two remaining directions, which are perpendicular to the slice surface and are also perpendicular to each other, so that the positional information in each direction is encoded in an echo signal.

In addition, a compensation current is applied to the gradient coil 103 and/or the above-described shim coil on the basis of the spatial and temporal information of an eddy current caused by application of a gradient magnetic field, which is detected in advance, in order to compensate for a magnetic field generated due to the eddy current.

The transmission RF coil 104 is a coil which irradiates the subject 101 with a high-frequency magnetic field (hereinafter, referred to as an RF) pulse, and is connected to the RF transmission unit 110 so that a high-frequency pulse current is supplied thereto. Then, nuclear magnetic resonance is induced in the nuclear spins of atoms which form the body tissue of the subject 101. Specifically, the RF transmission unit 110 is driven according to a command from the measurement control unit 111, which will be described later, to perform amplitude modulation of a high-frequency pulse. By supplying this amplified pulse to the transmission RF coil 104 disposed close to the subject 101, the subject 101 is irradiated with the RF pulse.

The receiving RF coil 105 is a coil which receives an echo signal (NMR signal) emitted by the NMR phenomenon of the nuclear spins which form the body tissue of the subject 101, and is connected to the signal detection unit 106 to transmit the received echo signal to the signal detection unit 106. The signal detection unit 106 performs detection processing of the echo signal received by the receiving RF coil 105. Specifically, a response echo signal of the subject 101 induced by the RF pulse irradiated from the RF transmission coil 104 is received in the receiving RF coil 105 disposed close to the subject 101. The signal detection unit 106 amplifies the received echo signal according to the command from the measurement control unit 111 to be described later, divides it into two signals perpendicular to each other by quadrature phase detection, performs sampling of each signal by the predetermined number (for example, 128, 256, or 512), converts each sampling signal into the digital amount by A/D conversion, and transmits it to the signal processing unit 107 to be described later. Accordingly, the echo signal is acquired as time-series digital data (hereinafter, referred to as echo data) including a predetermined number of sampling data items.

The measurement control unit 111 is a control unit that transmits various commands for data collection, which is necessary for reconstruction of a tomographic image of the subject 101, mainly to the gradient magnetic field power source 109, the RF transmission unit 110, and the signal detection unit 106 in order to control them. Specifically, the measurement control unit 111 operates under the control of the overall control unit 108 to be described later, and controls the gradient magnetic field power source 109, the RF transmission unit 110, and the signal detection unit 106 on the basis of a certain predetermined pulse sequence to repeatedly execute the application of an RF pulse and a gradient magnetic field pulse to the subject 101 and the detection of an echo signal from the subject 101 and collects the echo data necessary for reconstruction of a tomographic image of the subject 101.

In addition, the MRI apparatus related to the present invention includes not only the normal imaging sequence but also a calibration pulse sequence for measuring the eddy current magnetic field, which is caused by the gradient magnetic field, as the pulse sequence. The imaging sequence and the calibration pulse sequence are stored in advance in a storage unit as a program. A CPU reads a program of these pulse sequences and outputs a command to the measurement control unit 111 to execute the pulse sequences.

The overall control unit 108 performs control of the measurement control unit 111 and control of various kinds of data processing and display, storage, and the like of the processing result, and is configured to include an arithmetic processing unit, which has a CPU and a memory, and a storage unit, such as an optical disc and a magnetic disk. Specifically, the overall control unit 108 controls the measurement control unit 111 to collect the echo data. Then, when the echo data is input from the signal processing unit 107, the arithmetic processing unit executes processing, such as signal processing and image reconstruction by a Fourier transform, and displays a tomographic image of the subject 101, which is the result, on the display and operation unit 113, which will be described later, and also records the tomographic image on the storage unit.

The display and operation unit 113 includes a display for displaying the tomographic image of the subject 101 and an operating section for inputting various kinds of control information of the MRI apparatus or the control information of processing performed by the overall control unit 108, such as a track ball or a mouse and a keyboard. This operating section is disposed close to the display, so that the operator controls various kinds of processing of the MRI apparatus interactively through the operating section while observing the display.

Moreover, in FIG. 1, the RF transmission coil 104 at the transmission side and the gradient coil 103 are provided in the static magnetic field space of the static magnetic field generation magnet 102, in which the subject 101 is inserted, such that they face the subject 101 in the case of a vertical magnetic field method and they surround the subject 101 in the case of a horizontal magnetic field method. In addition, the receiving RF coil 105 at the receiving side is provided so as to face or surround the subject 101.

Nuclides imaged by current MRI apparatuses, which are widely used clinically, are a hydrogen nucleus (proton) which is a main component material of the subject. The shapes or functions of the head, abdomen, limbs, and the like of the human body are imaged in a two-dimensional or three-dimensional manner by imaging of the spatial distribution of proton density or the information regarding the spatial distribution of a relaxation time of an excited state.

In addition, a gradient magnetic field generating unit related to the present invention is mainly related to the measurement control unit 111, the gradient coil 103, and the gradient magnetic field power source 109. In addition, an eddy current magnetic field measuring unit is mainly related to the measurement control unit 111 and the arithmetic processing unit. In addition, a compensation magnetic field calculating unit is mainly related to the arithmetic processing unit.

(Effect of an Eddy Current and a Compensation Magnetic Field)

Next, an eddy current and a compensation magnetic field for compensating for a magnetic field based on the eddy current will be described briefly using FIG. 2. FIG. 2 shows the relationship between an output example of the gradient magnetic field waveform from the measurement control unit 111, which is shown at the left side (FIGS. 2(a) and 2(c)), and the gradient magnetic field waveform actually applied to the imaging region of the subject, which is shown at the right side (FIGS. 2(b) and 2(d)). In addition, the case where the compensation magnetic field is not generated is shown at the upper side (FIGS. 2(a) and 2(b)), and the case where the compensation magnetic field is generated is shown at the lower side (FIGS. 2(c) and 2(d)).

When the compensation magnetic field is not generated, the gradient magnetic field waveform (FIG. 2(a)) output from the measurement control unit 111 is an ideal rectangular waveform. By amplifying a current with this rectangular waveform by the gradient magnetic field power source and applying it to the gradient coil, a gradient magnetic field is applied to the imaging region of the subject. In this case, an eddy current is induced in various structures around the gradient coil. Accordingly, since the rectangular gradient magnetic field output by the gradient coil and the magnetic field due to the eddy current are superimposed, the gradient magnetic field actually applied to the imaging region has a distorted gradient magnetic field waveform shown in FIG. 2(b). As a result, the quality of an image deteriorates.

On the other hand, when the compensation magnetic field is generated, the measurement control unit 111 outputs a gradient magnetic field waveform (FIG. 2(c)) including a compensation magnetic field in advance so as to negate the above-described eddy current magnetic field. In this case, it becomes a waveform in which a rising portion of the rectangular waveform shown in FIG. 2(a) overshoots and a falling portion of the rectangular waveform undershoots. When the gradient magnetic field with such a waveform is applied to the imaging region of the subject through the gradient coil, a magnetic field due to the eddy current is generated as in the case of FIG. 2(a). However, since the overshoot portion, the undershoot portion, and the eddy current magnetic field offset each other, a gradient magnetic field waveform with an ideal rectangular shape is applied to the imaging region as shown in FIG. 2(d). As a result, the quality of an image is improved.

(Regarding a Cross Term of the Eddy Current Magnetic Field)

Next, a cross term of the eddy current magnetic field will be described on the basis of FIGS. 3A, 3B, and 3C. FIG. 3A shows a gradient magnetic field waveform actually applied to the imaging region of a subject when a gradient magnetic field 301 with a rectangular waveform is output from a gradient coil only in the X-axis direction. In this case, an X-direction component of the gradient magnetic field actually applied to the imaging region becomes a distorted waveform 302 as in FIG. 2. In addition, also in Y-axis and Z-axis directions in which a gradient magnetic field is not applied, eddy current magnetic fields 303 and 304 are slightly induced mainly in the vicinity of the rising portion and the falling portion of the applied gradient magnetic field, respectively, that is, in the vicinity of a point of time at which the applied gradient magnetic field changes greatly with time. These are the cross term of the eddy current magnetic field. That is, if applications of gradient magnetic fields in the respective directions are not independent of each other but coupled with each other, the application of the gradient magnetic field in one axial direction induces not only the eddy current magnetic field in the same axial direction but also the eddy current magnetic field in other axial directions. The main cause of coupling is that an eddy current induced in various structures near the gradient coil has a component in a direction different from the applied gradient magnetic field and a current of this component generates a magnetic field in a direction different from the direction of the applied gradient magnetic field.

Figure 3B:
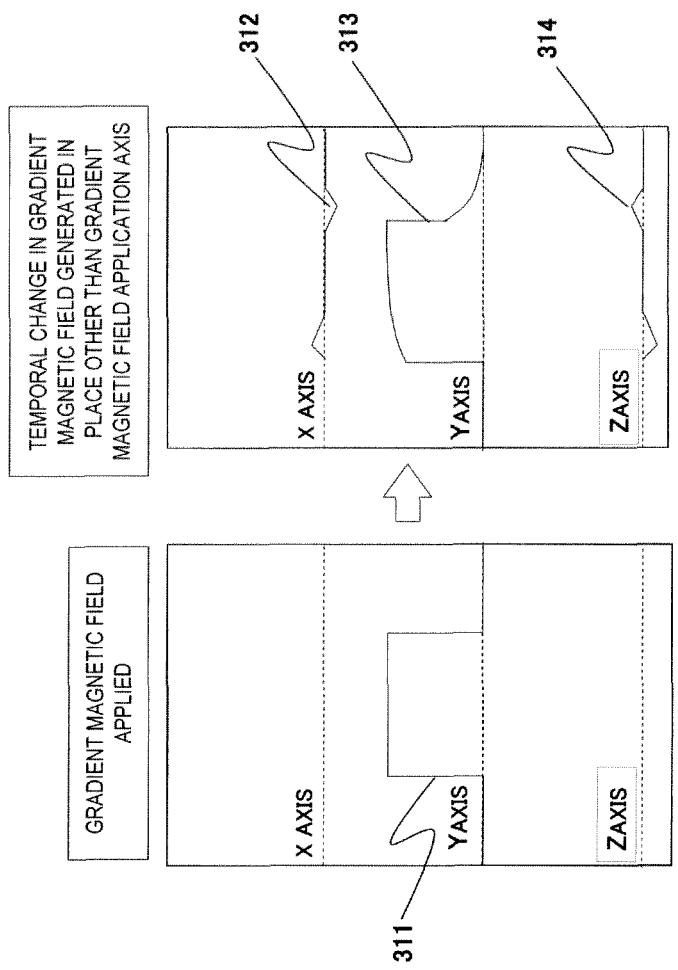
FIG. 3B is a view showing a gradient magnetic field waveform actually applied to an imaging region of a subject when a gradient magnetic field with a rectangular waveform is output from a gradient coil only in the Y-axis direction.

Similarly, FIG. 3B shows a gradient magnetic field waveform actually applied to the imaging region of a subject when a gradient magnetic field 311 with a rectangular waveform is output from a gradient coil only in the Y-axis direction. In this case, a Y-direction component 313 of the gradient magnetic field actually applied to the imaging region becomes a distorted waveform as in FIG. 2. In addition, also in the X-axis and Z-axis directions in which a gradient magnetic field is not applied, eddy current magnetic fields 312 and 314 are slightly induced, respectively.

Similarly, FIG. 3C shows a gradient magnetic field waveform actually applied to the imaging region of a subject when a gradient magnetic field 321 with a rectangular waveform is output from a gradient coil only in the Z-axis direction. In this case, a Z-direction component 324 of the gradient magnetic field actually applied to the imaging region becomes a distorted waveform as in FIG. 2. In addition, also in the X-axis and Y-axis directions in which a gradient magnetic field is not applied, eddy current magnetic fields 322 and 323 are slightly induced, respectively.

(Eddy Current Measurement)

Next, the calibration pulse sequence for measuring an eddy current magnetic field caused by the gradient magnetic field will be described.

First, an operator places a phantom in the static magnetic field and instructs a CPU to execute the calibration pulse sequence through an operating section (not shown). According to the instruction from the operator, the CPU reads the calibration pulse sequence from the storage unit and makes the measurement control unit 111 execute it.

Any sequence may be used as this calibration pulse sequence if it is a sequence capable of detecting a phase change ($\phi$ji) caused by an eddy current magnetic field, which is generated in a predetermined j direction due to an eddy current generated by a test gradient magnetic field with predetermined application time and strength, by applying the test gradient magnetic field in a predetermined axial direction (i direction) and then reading an echo signal in a predetermined frequency encoding direction (j direction).

In this example, however, not only the amount of phase change ($\phi$xx, $\phi$yy, $\phi$zz) caused by the eddy current magnetic field generated in the frequency encoding direction (j direction), which is the same direction as the application direction (i direction) of the test gradient magnetic field, as in the related art but also the amount of phase change ($\phi$xy, $\phi$yx, $\phi$yz, $\phi$zy, $\phi$zx, $\phi$xz) caused by an eddy current magnetic field of a cross term occurring in a direction perpendicular to the frequency encoding direction is measured. For this reason, the calibration pulse sequence needs to be a sequence capable of setting the application direction of the test gradient magnetic field and the frequency encoding direction at each of X, Y, and Z axes.

Figure 4:
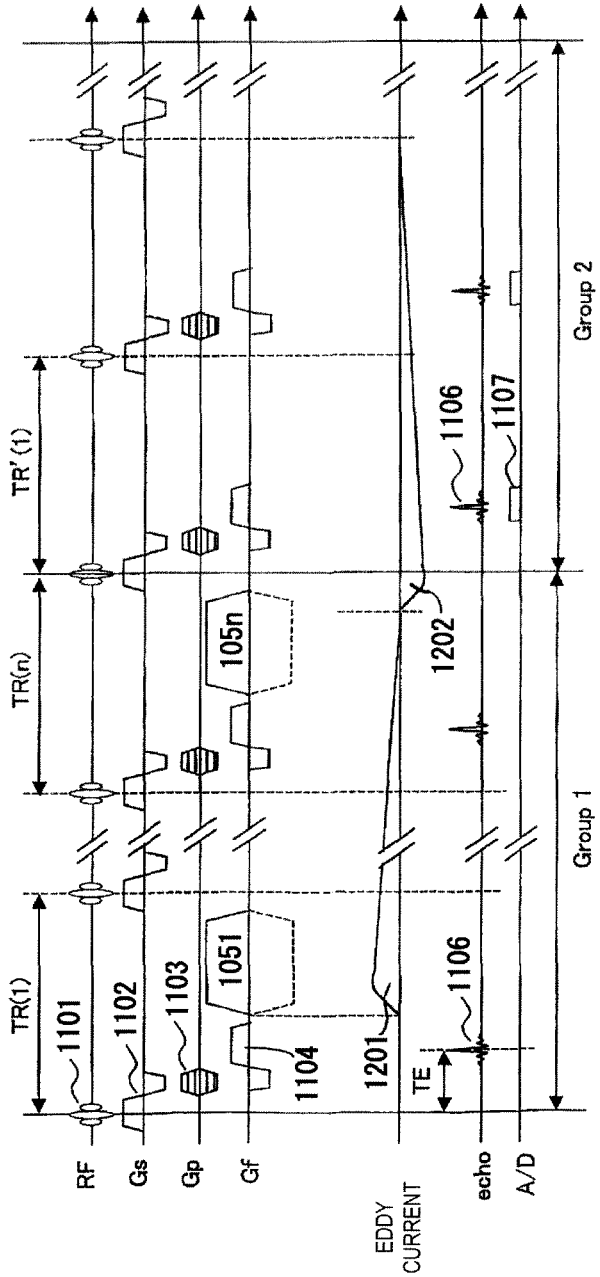
FIG. 4 is a sequence chart showing an example of a calibration pulse sequence for measuring an eddy current magnetic field caused by a gradient magnetic field.

For example, it is possible to use a calibration pulse sequence shown in FIG. 4, and which is disclosed in PTL 2. This sequence is to perform a short TR pulse sequence repeatedly by a gradient echo method, and includes a unit (group 1 in FIG. 4) for which a test gradient magnetic field 1051 is applied and a unit (group 2) for which a test gradient magnetic field is not applied. In both the group 1 and the group 2 in FIG. 4, an arbitrary section of the phantom is excited by applying a slice selection gradient magnetic field 1102 in a Gs direction while emitting an RF pulse 1101, performing phase encoding by applying a phase encoding gradient magnetic field 1103 in a Gp direction, and then applying a frequency encoding gradient magnetic field 1104 in a Gf direction to generate an echo signal 1106. This is performed repeatedly a plural number of times for a predetermined time TR.

At this time, in the group 1, test gradient magnetic fields 1051 to 105n with predetermined strength and time are applied in a predetermined i direction (in FIG. 2, i direction=Gf direction) every TR. The generated echo signal 1106 is not acquired in the group 1, and the echo signal 1106 is acquired in a time 1107 in the group 2. Accordingly, a change in the magnetic field caused by an eddy current 1202 generated due to the test gradient magnetic fields 1051 to 105n can be measured by the echo signal 1106. The amount of phase encoding is set to the same value in the group 1 and the group 2. The group 1 and the group 2 are repeated while changing the amount of phase encoding, and this continues until a number of echo signals necessary for image reconstruction is acquired in each TR of the group 2. Then, the polarities of the test gradient magnetic fields 1051 to 105n are reversed to similarly acquire a number of echo signals necessary for image reconstruction in each TR of the group 2.

In FIG. 4, the generated echo signal 1106 is not acquired in the group 1, and the echo signal 1106 is acquired in the time 1107 in the group 2. This is to set the nuclear spins in a steady-state precession state by applying the RF pulse 1101 repeatedly in the group 1 and to repeatedly acquire the echo signal 1106 while maintaining the signal strength level in the group 2, as also disclosed in PTL 2. In addition, this is because the same effect as when applying a large magnetic field for a long time is also acquired by applying a pulse magnetic field repeatedly for a short time for the test gradient magnetic fields 1051 to 105n and the burden of the gradient coil is reduced accordingly. In addition, in the case of the sequence of FIG. 4, an operation capable of measuring a change in the eddy current 1202 generated at the time of falling in the group 2 selectively by the echo signal 1106 by continuing the group 1 while the eddy current 1201 generated at the time of rising of the magnetic field continues is also obtained. On the contrary, when measuring the change in the eddy current 1201 generated at the time of rising, the echo signal 1106 is not measured in the group 2 and the echo signal is measured in the group 1. However, this is an example, and a phase image may be acquired by changing the correspondence relationship of Gs, Gp, and Gf and the X, Y, and Z axes and the application axis of the test gradient magnetic field 1051 or the like.

Hereinafter, each embodiment of the MRI apparatus and the eddy current compensation method of the present invention will be described. The outline of the present invention is that a test gradient magnetic field is applied and eddy current magnetic fields generated in the application direction of the test gradient magnetic field and in a direction different from the application direction are measured. Then, on the basis of the eddy current magnetic field measured in each direction, a compensation magnetic field for compensating for an eddy current magnetic field, which is caused by application of an arbitrary gradient magnetic field, for each direction is calculated. Finally, the calculated compensation magnetic field in each direction is generated together with the arbitrary gradient magnetic field. Preferably, eddy current magnetic fields in a predetermined one direction and a direction perpendicular to the predetermined one direction are measured on the basis of the echo signals measured at a pair of slice positions perpendicular to the predetermined one direction.

Accordingly, a magnetic field caused by an eddy current generated due to a gradient magnetic field can be measured not only in the application direction of the gradient magnetic field but also including a cross term. In addition, using this measurement result, a magnetic field caused by an eddy current generated due to application of a gradient magnetic field can be corrected not only in the application direction of the gradient magnetic field but also in the direction different from the application direction of the gradient magnetic field. As a result, the quality of an image is improved.

First Embodiment

Next, a first embodiment of the MRI apparatus and the eddy current compensation method of the present invention will be described.

In the present embodiment, not only a phase change based on the eddy current magnetic field generated in the application direction of the test gradient magnetic field but also a phase change based on the eddy current magnetic field generated in a direction different from the application direction are acquired using a phase image acquired by applying the test gradient magnetic field. More specifically, a test gradient magnetic field is applied in a predetermined one direction to measure an echo signal, a phase image showing a phase change by application of the test gradient magnetic field is reconstructed at each slice position on the basis of the echo signal, and the amounts of phase change in the predetermined one direction and a direction perpendicular to the predetermined one direction on a pair of phase images are acquired. Through such acquisition of the amount of phase change, eddy current magnetic fields generated in the predetermined one direction and a direction perpendicular to the predetermined one direction by application of the test gradient magnetic field are measured. The measurement of the eddy current magnetic field through the acquisition of the amount of phase change is the same as in each embodiment to be described below.

In addition, a compensation parameter which specifies a compensation magnetic field for compensating for the eddy current magnetic field in each direction is calculated from these amounts of phase change, and the eddy current magnetic field in each direction is compensated for using this compensation parameter. Also when calculating the compensation magnetic field for compensating for the eddy current magnetic field through the calculation of a compensation parameter from the amount of phase change, the slice position at which a phase image, which is the same as in each embodiment described below, is acquired is assumed to be a pair of slice positions which are symmetrical with respect to the origin or the coordinate plane perpendicular to the direction in a predetermined one direction. In addition, at a pair of slice positions of points or regions where the specific phase values are acquired, phase values of the vertices of the rectangular shape or regions including the vertices which are symmetrical with respect to the origin or the coordinate plane perpendicular to the direction in a predetermined direction are acquired. Therefore, just by imaging a pair of slice positions in a predetermined one direction, a phase change based on the application of the test gradient magnetic field in each of the three axial directions perpendicular to each other and a compensation parameter, which specifies the compensation magnetic field for compensating for eddy current magnetic fields in the three axial directions perpendicular to each other from the phase change in each axial direction, are calculated.

First, the outline of eddy current measurement and an approximation method of the present embodiment will be described.

Using the calibration pulse sequence described above, a plurality of phase images with different acquisition times are acquired by applying the test gradient magnetic field 1051 or the like in the i direction and setting the j direction as a frequency encoding direction. Then, a plurality of phase images with different acquisition times are acquired by applying the test gradient magnetic field 1051 with reversed polarities or the like in the i direction and setting the j direction as a frequency encoding direction. Then, a plurality of phase difference images with different acquisition times are acquired by differentiation of phase images with the same acquisition time. The phase value of the same position (for example, the origin) on the respective phase difference images with different acquisition times acquired as described above indicates a temporal change in the eddy current magnetic field at the position.

Then, the plurality of phase values with different acquisition times is fitted to a nonlinear function. For example, a phase difference between two points equidistant from the origin in a direction, in which a temporal change in the eddy current magnetic field is calculated, is calculated and nonlinear approximation of the phase difference is performed using a Levenberg-Marquardt method or the like.

$$\text{Measurement data }(t_i) = A_0 + A_1 \text{Exp}(-t_i/\tau_{g1}) + A_2 \text{Exp}(-t_i/\tau_{g2}) + \ldots + A_m \text{Exp}(-t_i/\tau_{gm}) \quad (1)$$

Thus, the measurement data is decomposed into a plurality of sets of amplitudes (A) and time constants ($\tau$), and these plural sets of amplitudes (A) and time constants ($\tau$) are set as compensation parameters.

Figure 5:
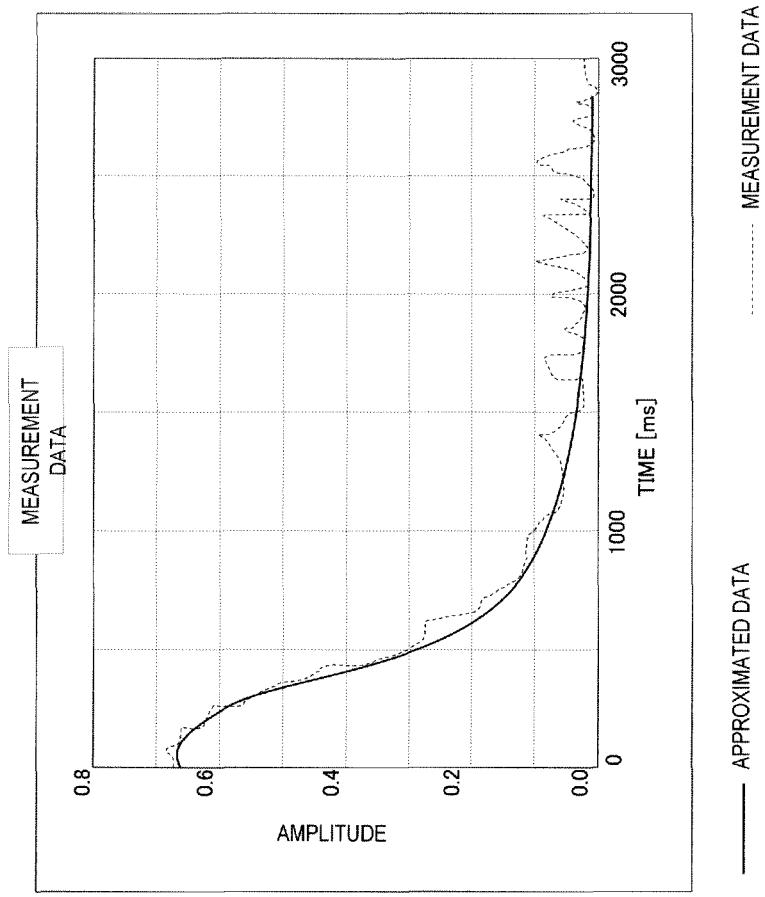
FIG. 5 is a graph showing an example of a temporal change in the phase value and the nonlinear approximation. A dotted line shows actual measurement data, and a solid line shows the nonlinear approximation.

These compensation parameters are stored in a storage unit. Then, at the time of execution of an arbitrary pulse sequence, the CPU reads these compensation parameters from the storage unit and notifies the measurement control unit 111 of it. On the basis of these compensation parameters and the gradient magnetic field specified by the pulse sequence, the measurement control unit 111 calculates a compensation magnetic field, which is for compensating for the eddy current magnetic field based on the gradient magnetic field, using the same approximation method as Expression (1) and controls a gradient magnetic field power source to generate a gradient magnetic field to which the compensation magnetic field is added. FIG. 5 shows an example of a temporal change in the phase value and the nonlinear approximation. A dotted line shows actual measurement data, and a solid line shows the nonlinear approximation.

Figure 6:
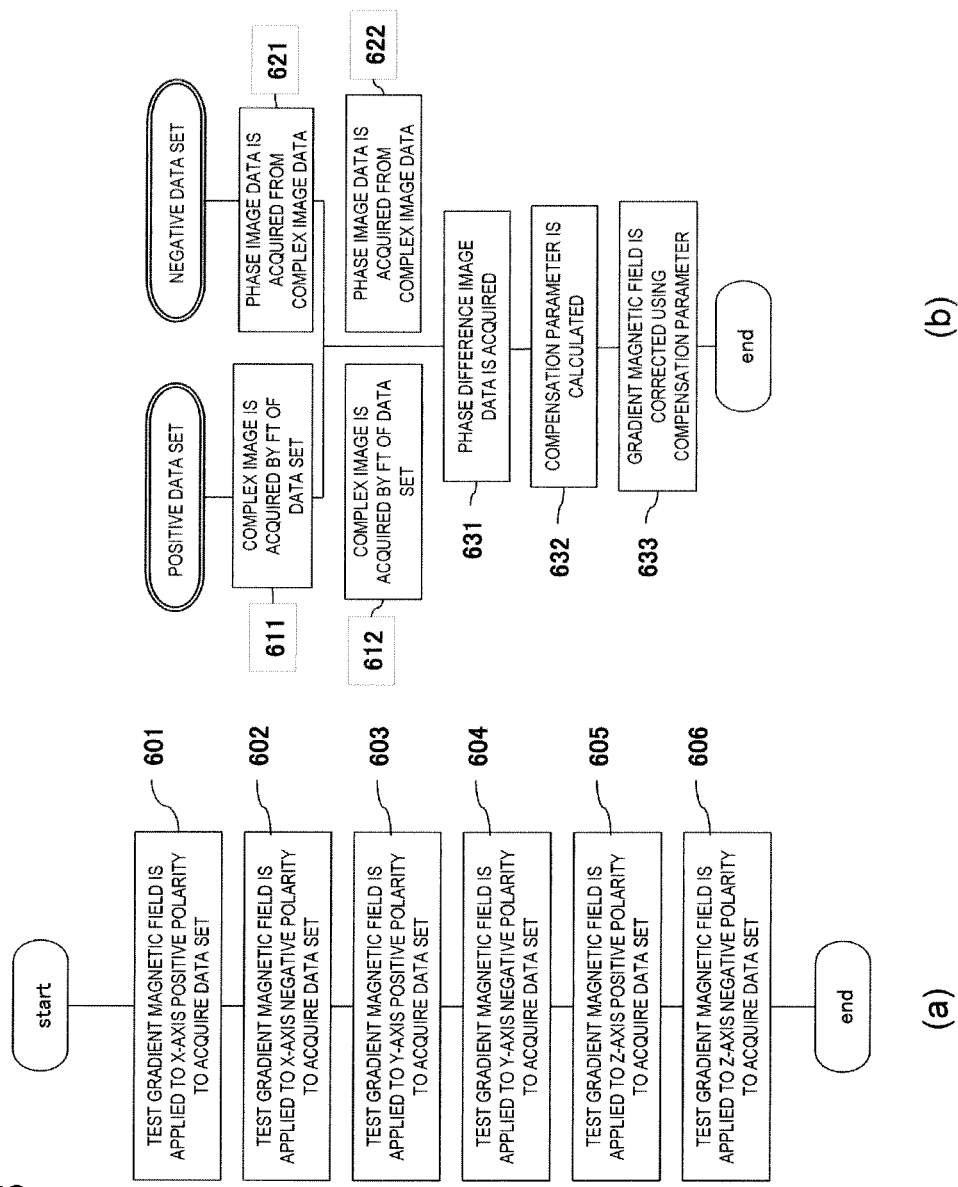
FIG. 6 is a flow chart showing the operation flow of the present embodiment.
Figure 7:
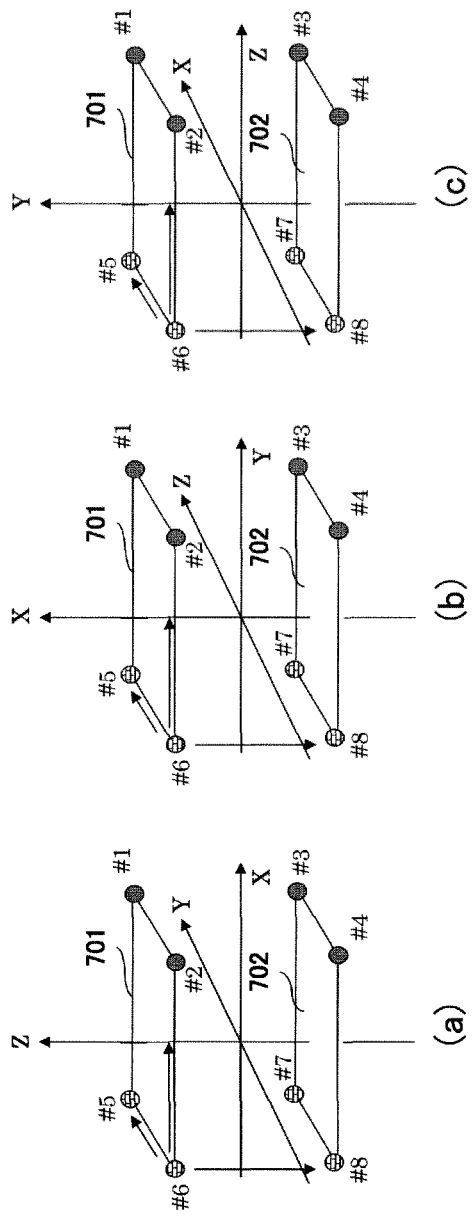
FIG. 7 is a view showing the positional relationship between points or regions in which the phase value of a phase difference image is acquired.

Next, a measurement method of calculating a cross term of the eddy current magnetic field of the present embodiment will be described using FIGS. 6 and 7. FIG. 6 is a flow chart showing the operation flow of the present embodiment. FIG. 6(*a*) is an operation flow for acquiring the calibration data using a calibration pulse sequence, and FIG. 6(*b*) is a processing flow of the acquired calibration data. These operation flows are stored in advance as a program in a storage unit, such as a magnetic disk, and are executed when a CPU reads it into the memory to execute it when necessary. FIG. 7 is a view showing the positional relationship between points or regions in which the phase value of a phase difference image is acquired. Hereinafter, each step of FIG. 6 will be described in detail.

In step 601, the measurement control unit 111 sets the slice direction (Gs) at the Z axis, the phase encoding direction (Gp) at the Y axis, and the frequency encoding direction (Gf) at the X axis on the basis of advance setting of the operator in the sequence of FIG. 4, and the positive test gradient magnetic field 1051 or the like is applied to the X axis and an echo signal from the predetermined slice position is measured. As shown in FIG. 7(*a*), the slice position is a pair of slice positions which are symmetrical with respect to the origin or the XY plane, are separated by a predetermined distance in the Z-axis direction, and are parallel to the XY plane. In order to acquire each image of a pair of slice positions at predetermined time intervals (TR), the measurement control unit 111 measures each echo signal and sets it as a data set of the positive test gradient magnetic field. In addition, if necessary, a predetermined distance in the Z-axis direction may be changed to acquire an image of the XY plane including the origin or images of N pairs of slice positions. That is, two or more images are acquired.

Thus, by acquiring images of a pair of or two or more slice positions in one direction (in this case, the Z-axis direction), compensation parameters of eddy current magnetic fields not only in this one direction but also in other directions are calculated from these images. In addition, a pair of slice positions parallel to the YZ plane shown in FIG. 7(*b*) or a pair of slice positions parallel to the ZX plane shown in FIG. 7(*c*) may be used instead of the pair of slice positions parallel to the XY plane.

In step 602, the measurement control unit 111 applies the negative test gradient magnetic field 1051 or the like to measure an echo signal in the same manner as in step 601 and acquires a data set of the negative test gradient magnetic field.

In steps 603 and 604, the measurement control unit 111 changes the application axis of the test gradient magnetic field 1051 or the like to the Y axis, measures an echo signal in the same manner as in steps 601 and 602, and acquires a data set of the test gradient magnetic field with positive and negative polarities.

In steps 605 and 606, the measurement control unit 111 changes the application axis of the test gradient magnetic field 1051 or the like to the Z axis, measures an echo signal in the same manner as in steps 601 and 602, and acquires a data set of the test gradient magnetic field with positive and negative polarities.

Then, the obtained data set is processed as shown in FIG. 6(*b*). By the calibration pulse sequence in FIG. 4, a data set (echo signal 1106) acquired in steps 601 to 606 is influenced not only by the phase information by a magnetic field, which is caused by an eddy current generated due to the test gradient magnetic field 1051 or the like, but also by the unevenness of the static magnetic field or an eddy current by the phase encoding gradient magnetic field 1103 or the frequency encoding gradient magnetic field 1104. Accordingly, as shown in FIG. 6(*b*), a phase difference image data set including only the eddy current magnetic field caused by the test gradient magnetic field is obtained by performing difference processing of phase images of the same slice position calculated by applying each of the positive and negative test gradient magnetic fields.

Hereinafter, the processing flow of a data set acquired by applying the test gradient magnetic field in the X-axis direction in steps 601 and 602 of FIG. 6(*a*) will be described. The processing flow of a data set acquired by applying the test gradient magnetic field in the Y-axis direction in steps 603 and 604 and the processing flow of a data set acquired by applying the test gradient magnetic field in the Z-axis direction in steps 605 and 606 are the same processing.

In step 611, the CPU performs two-dimensional Fourier transform of the data set of the echo signal 1106, which is acquired by applying the positive test gradient magnetic field 1051 or the like in the X-axis direction in step 601, at predetermined time intervals (TR). As a result, time-resolved two-dimensional complex image (a real image and an imaginary image) data is reconstructed. Since this echo signal is measured by setting the slice direction (GS) at the Z axis, the phase direction (Gp) at the Y axis, and the frequency encoding direction (Gf) at the X axis and applying the positive test gradient magnetic field 1051 or the like in the X-axis direction, the reconstructed two-dimensional complex image is an image of the XY plane as shown in FIG. 7(*a*).

In step 612, the CPU calculates a phase from the arctangent of the ratio between real and imaginary parts of each point of the complex image calculated in step 611 and acquires a pair of or two or more phase image data items which are symmetrical with respect to the origin or the XY plane, are separated by a predetermined distance in the Z direction, and are parallel to the XY plane.

In step 621, the CPU performs a two-dimensional Fourier transform of the data set of the echo signal 1106, which is acquired by applying the negative test gradient magnetic field 1051 or the like in the X-axis direction in step 601, at predetermined time intervals (TR), in the same manner as in step 611. As a result, time-resolved two-dimensional complex image (a real image and an imaginary image) data is reconstructed.

In step 622, the CPU calculates a phase from the arctangent of the ratio between real and imaginary parts of each point of the complex image calculated in step 621 and acquires a pair of or two or more phase image data items which are symmetrical with respect to the origin, are separated by a predetermined distance in the Z direction, and are parallel to the XY plane, in the same manner as in step 612.

In step 631, the CPU calculates a phase difference between a pair of or two or more phase images acquired in step 612 and a pair of or two or more phase images acquired in step 622 and acquires a pair of or two or more phase difference image data items which are symmetrical with respect to the origin or the XY plane, are separated by a predetermined distance in the Z direction, and are parallel to the XY plane. FIG. 7(*a*) shows a case where two or more phase difference images are acquired. The obtained phase difference image data becomes a phase image including only the influence of an eddy current generated due to the test gradient magnetic field 1051 or the like since the influence by the unevenness of the static magnetic field or the influence by an eddy current caused by the phase encoding gradient magnetic field 1103 or the frequency encoding gradient magnetic field 1104 is removed.

The application direction (i direction) of the test gradient magnetic field 1051 in steps 601 and 602 is the X axis. Therefore, the phase data of two points or two regions (for example, (#1 and #5), (#2 and #6), (#3 and #7), and (#4 and #8)), which are separated by a predetermined distance in the X-axis direction and are set in advance, on the phase difference image in FIG. 7(*a*) show a phase component generated in the X-axis direction (j=i direction) by the eddy current magnetic field caused by the test gradient magnetic field 1051 applied to the X axis (i direction). Accordingly, by taking the difference between the phase data of these two points or two regions, the amount of phase change $\phi xx$ in the X-axis direction when the test gradient magnetic field is applied in the X-axis direction can be acquired at predetermined time intervals (TR). In addition, the obtained amount of phase change $\phi xx$ may be divided by a distance $\Delta X$ between two points or two regions, and the result may be set as the amount of phase change $\phi xx$ per unit length. In the case of calculating a plurality of phase differences between two points or two regions, the average may be set as the amount of phase change $\phi xx$. This is the same for subsequent calculation.

Similarly, the phase data of two points or two regions (for example, (#1 and #2), (#3 and #4), (#5 and #6), (#7 and #8)), which are separated by a predetermined distance in the Y-axis direction and are set in advance, on the phase difference image in FIG. 7(*a*) show a phase component generated in the Y-axis direction (j direction) by the eddy current magnetic field caused by the test gradient magnetic field 1051 applied to the X axis (i direction). Accordingly, by taking the difference between the phase data of these two points or two regions, the amount of phase change $\phi ji=\phi yx$ can be acquired at predetermined time intervals (TR). In addition, the obtained amount of phase change $\phi xx$ may be divided by a distance $\Delta Y$ between two points or two regions, and the result may be set as the amount of phase change $\phi yx$ per unit length.

Similarly, the phase data of two points or two regions (for example, (#1 and #3), (#2 and #4), (#5 and #7), and (#6 and #8)), which are separated by a predetermined distance in the Z-axis direction and are set in advance, on the phase difference image in FIG. 7(*a*) show a phase component generated in the Z-axis direction (j direction) by the eddy current magnetic field caused by the test gradient magnetic field 1051 applied to the X axis (i direction). Accordingly, by taking the difference between the phase data of these two points or two regions, the amount of phase change $\phi ji=\phi zx$ can be acquired at predetermined time intervals (TR). In addition, the obtained amount of phase change $\phi zx$ may be divided by a distance $\Delta Z$ between two points or two regions, and the result may be set as the amount of phase change $\phi zx$ per unit length.

In step 632, for each of the amounts of phase change $\phi xx$, $\phi yx$, and $\phi zx$, the CPU decomposes a change in each predetermined time interval (TR) into a plurality of sets of amplitudes (A) and time constants ($\tau$) as in Expression (1) by performing non-linear approximation using the Levenberg-Marquardt method or the like as described above and calculates them as compensation parameters. That is, a compensation parameter for compensating for the eddy current magnetic field generated in the X-axis direction by the gradient magnetic field applied in the X-axis direction is calculated from the amount of phase change $\phi xx$ in each predetermined time interval (TR), a compensation parameter for compensating for the eddy current magnetic field generated in the Y-axis direction by the gradient magnetic field applied in the X-axis direction is calculated from the amount of phase change $\phi yx$ in each predetermined time interval (TR), and a compensation parameter for compensating for the eddy current magnetic field generated in the Z-axis direction by the gradient magnetic field applied in the X-axis direction is calculated from the amount of phase change $\phi zx$ in each predetermined time interval (TR). In addition, the CPU stores these compensation parameters in the storage unit.

In step 633, when applying a gradient magnetic field in the X-axis direction, the CPU reads the compensation parameters calculated in step 632 from the storage unit and notifies the measurement control unit 111 of them. On the basis of these compensation parameters, the measurement control unit 111 controls the gradient magnetic field power source to generate a gradient magnetic field in which a compensation magnetic field for compensating for an eddy current magnetic field based on the application of this gradient magnetic field in the X-axis direction is added to a gradient magnetic field in each axial direction. In this case, the gradient magnetic field in the X-axis direction is output in a state where the compensation magnetic field in the X-axis direction is added thereto, but the gradient magnetic fields in the Y-axis direction and the Z-axis direction become outputs only compensation magnetic fields.

Until now, the processing flow of a data set acquired by applying the test gradient magnetic field in the X-axis direction has been described.

The above processing flow is also similarly applied to the case where a compensation parameter is acquired by applying a test gradient magnetic field in the Y-axis direction. That is, in steps 603 and 604, the measurement control unit 111 acquires a data set by acquiring a test gradient magnetic field in the Y-axis direction. Then, as processing equivalent to steps 611 to 632, the CPU acquires at predetermined time intervals (TR) the amount of phase change ϕyy due to the eddy current magnetic field in the Y-axis direction, the amount of phase change ϕxy due to the eddy current magnetic field in the X-axis direction which is a cross term, and the amount of phase change ϕzy due to the eddy current magnetic field in the Z-axis direction which is a cross term. The CPU decomposes these amounts of phase change into a plurality of sets of amplitudes (A) and time constants (τ) as in Expression (1) by non-linear approximation and sets these as compensation parameters. Then, as processing equivalent to step 633, the measurement control unit 111 controls the gradient magnetic field power source to generate a gradient magnetic field in each corresponding direction by adding a compensation magnetic field, which is for compensating for an eddy current magnetic field based on this gradient magnetic field in the Y-axis direction, to the gradient magnetic field in each axial direction on the basis of these compensation parameters when applying a compensation magnetic field in the Y-axis direction. In this case, the gradient magnetic field in the Y-axis direction is output in a state where the compensation magnetic field in the Y-axis direction is added thereto, but the gradient magnetic fields in the Z-axis direction and the X-axis direction become outputs of only compensation magnetic fields.

In addition, similarly, in steps 605 and 606, the measurement control unit 111 acquires a compensation parameter by applying a test gradient magnetic field in the Z-axis direction. Then, as processing equivalent to steps 611 to 632, the CPU acquires at predetermined time intervals (TR) the amount of phase change ϕzz due to the eddy current magnetic field in the Z-axis direction, the amount of phase change ϕzz due to the eddy current magnetic field in the X-axis direction which is a cross term, and the amount of phase change ϕyz due to the eddy current magnetic field in the Y-axis direction which is a cross term. The CPU decomposes these amounts of phase change into a plurality of sets of amplitudes (A) and time constants (τ) as in Expression (1) by non-linear approximation and sets these as compensation parameters. Then, as processing equivalent to step 633, the measurement control unit 111 controls the gradient magnetic field power source to generate a gradient magnetic field in each corresponding direction by adding a compensation magnetic field, which is for compensating for an eddy current magnetic field based on this gradient magnetic field in the Z-axis direction, to the gradient magnetic field in each axial direction on the basis of these compensation parameters when applying a gradient magnetic field in the Z-axis direction. In this case, the gradient magnetic field in the Z-axis direction is output in a state where the compensation magnetic field in the Z-axis direction is added thereto, but the gradient magnetic fields in the X-axis direction and the Y-axis direction become outputs only compensation magnetic fields.

Until now, the operation flow of the present embodiment has been described.

In addition, the following processing may be added. That is, the slice surface including the magnetic field center is imaged to acquire a phase difference image of the slice position, and to acquire the phase data of the magnetic field center (0 position), and the phase data of the magnetic field center is set as a reference phase. Then, the phase data acquired in points or regions other than the magnetic field center is compared with the reference phase. In this way, it is determined whether or not the phase data acquired in points or regions distant from the magnetic field center is proper. Moreover, only when it is determined that the phase data is proper, an operation of calculating a compensation parameter may be performed. Thus, the accuracy and reliability of compensation parameters can be improved.

As described above, according to the MRI apparatus and the eddy current compensation method of the present embodiment, it becomes possible to measure a temporal change in a cross term of not only an eddy current magnetic field generated in the application direction of the gradient magnetic field but also eddy current magnetic fields generated in directions different from the application direction. Therefore, on the basis of these measurement results, it is possible to compensate for eddy current magnetic fields generated not only in the application direction of the gradient magnetic field but also in directions different from this. As a result, since not only the eddy current magnetic field in the application direction of the gradient magnetic field but also the cross term is included, it is possible to acquire a high-quality image in which these influences are removed.

Second Embodiment

Next, a second embodiment of the MRI apparatus and the eddy current compensation method of the present invention will be described.

In the present embodiment, rectangles with different sizes are set on phase difference images acquired at two or more pairs of slice positions perpendicular to the predetermined one direction, and the amount of phase change is acquired using the phase of each vertex of the rectangle or a region including the vertex. More specifically, the amount of phase change in each axial direction is calculated by calculating the phase data of a plurality of points or regions on two or more pairs of phase difference images perpendicular to the predetermined one direction. In this case, an in-plane position of a point or a region in which the phase data is acquired is changed every pair of phase difference images. Then, the average of the plurality of amounts of phase change in each direction is calculated, and this is set as the final amount of phase change.

Hereinafter, different parts from the first embodiment in the case where a test gradient magnetic field is applied in the X-axis direction with the Z-axis direction as a slice direction as shown in FIG. 7(*a*) will be described.

First, the outline of a phase difference image and the positional relationship between points or regions, in which the phase data is acquired, on the phase difference image in the present embodiment will be described on the basis of FIG. 8. In the present embodiment, M (for example, M=2) pairs of phase difference images which are symmetrical with respect to the origin or the XY plane, are separated by a predetermined distance in the Z-axis direction, and are parallel to the XY plane are acquired by changing a predetermined distance in the Z-axis direction. Since the method of acquiring each phase difference image is the same as that in the first embodiment described above, detailed explanation thereof will be omitted. In addition, phase data of points or regions, which are symmetrical with respect to the XY plane, on each pair of phase difference images, is calculated.

Figure 8:
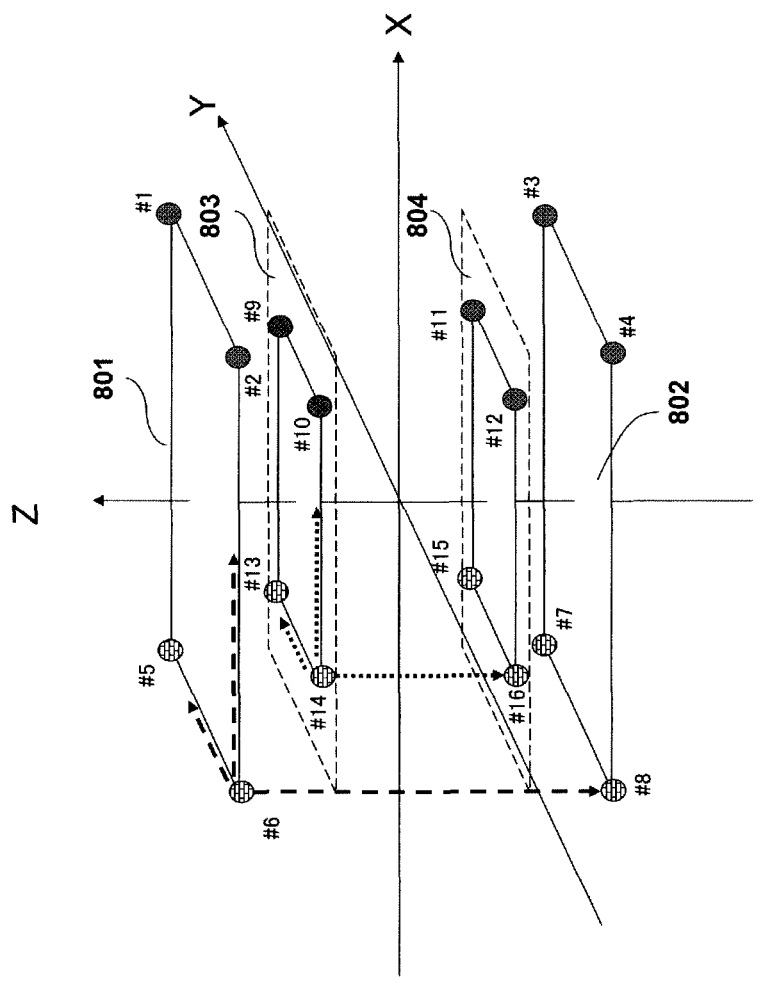
FIG. 8 is a view showing a phase difference image and the positional relationship between points or regions, in which the phase data is acquired, in the phase difference image in a second embodiment.

For example, in a pair of phase difference images 801 and 802 located at the outer side in the Z-axis direction in FIG. 8, phase data of points or regions (#1, #2, #5, #6) and (#3, #4, #7, #8) which are symmetrical with respect to the XY plane is acquired. In this case, each point or region is set so as to satisfy the positional relationship in which (#1->#2), (#3->#4), (#5->#6), (#7->#8) are parallel to the Y axis, (#1->#5), (#2->#6), (#3->#7), (#4->#8) are parallel to the X axis, and (#1->#3), (#2->#4), (#5->#7), (#6->#8) are parallel to the Z axis.

On the other hand, positions within the XY plane of points or regions (#9, #10, #13, #14) and (#11, #12, #15, #16), in which the phase data is acquired, in a pair of phase difference images 803 and 804 located at the inner side in the Z-axis direction are set to be different from those of (#1, #2, #5, #6) and (#3, #4, #7, #8) in the pair of phase difference images 801 and 802. In FIG. 8, the phase data acquisition points or regions in the pair of phase difference images 803 and 804 are set further inward on the XY plane than the phase data acquisition points or regions (#1, #2, #5, #6) and (#3, #4, #7, #8) set in the pair of phase difference images 801 and 802. In addition, the phase data acquisition points or regions in the pair of phase difference images 803 and 804 may be set further outward on the XY plane than the phase data acquisition points or regions (#1, #2, #5, #6) and (#3, #4, #7, #8) set in the pair of phase difference images 801 and 802 instead of being set further inward. In addition, similar to (#1, #2, #5, #6) and (#3, #4, #7, #8), each point or region is set so as to satisfy the positional relationship in which (#9->#10), (#13->#14), (#11->#12), (#15->#16) are parallel to the Y axis, (#9->#13), (#10->#14), (#11->#15), (#12->#16) are parallel to the X axis, and (#9->#11), (#10->#12), (#13->#15), (#14->#16) are parallel to the Z axis.

Then, a phase difference between two points or regions parallel to the each axis (j) direction is calculated from the phase data of each point or region acquired by applying the test gradient magnetic field in the X-axis (i) direction, such that a plurality of amounts of phase change ($\phi ji$) are calculated. In addition, the obtained amount of phase change ($\phi ji$) may be divided by a distance $\Delta j$ between two points or two regions, which are parallel to the j direction, and the result may be set as the amount of phase change $\phi ji$ per unit length. When calculating the same amount of phase change ($\phi ji$) from the phase data of different points or regions, the average is set as the final amount of phase change ($\phi ji$). Then, similar to the first embodiment described above, this amount of phase change ($\phi ji$) is acquired at predetermined time intervals (TR) and non-linear approximation of these is performed to decompose them into a plurality of sets of amplitudes (A) and time constants ($\tau$) as in Expression (1), and the results are set as compensation parameters.

Next, only different processing from the above first embodiment in the operation flow of the present embodiment will be described on the basis of the flow chart shown in FIG. 6.

In steps 601 to 606 in the present embodiment, the measurement control unit 111 measures an echo signal from a predetermined slice position by applying a test gradient magnetic field using the calibration pulse sequence in FIG. 4. As shown in FIG. 8, this slice position is M (for example, M=2) pairs of slice positions obtained by changing a pair of slice positions, which are symmetrical with respect to the origin or the XY plane, are separated by a predetermined distance in the Z-axis direction, and are parallel to the XY plane, by a predetermined distance in the Z-axis direction. In order to acquire each image of M pairs of slice positions at predetermined time intervals (TR), the measurement control unit 111 measures each echo signal and sets it as a data set. In addition, phase data of the magnetic field center (0 position) may be acquired as a reference as described above.

Then, in steps 611 to 632 in the present embodiment, the CPU acquires M (for example, M=2) pairs of phase difference image data by changing phase difference image data of a pair of slice positions, which are symmetrical with respect to the origin or the XY plane, are separated by a predetermined distance in the Z-axis direction, and are parallel to the XY plane, by a predetermined distance in the Z-axis direction at predetermined time intervals (TR) using the data set acquired in steps 601 to 606. Then, the CPU calculates the amount of phase change ($\phi ji$) by calculating a difference between the phase data of two points or two regions, which are separated by a predetermined distance in each axial direction. In this case, the CPU changes the positions within the XY plane of the two points or the two regions for each pair of phase difference images in order to calculate a plurality of amounts of phase change ($\phi ji$). In this case, the obtained amount of phase change ($\phi ji$) may be divided by a distance between the two points or the two regions, which have been used to calculate the amount of phase change ($\phi ji$), and the result may be set as the amount of phase change per unit length. Then, the average of the plurality of amounts of phase change ($\phi ji$) is set as the final amount of phase change ($\phi ji$). Finally, the CPU calculates a compensation parameter by performing nonlinear approximation using the amount of phase change ($\phi ji$) at predetermined time intervals (TR) and stores the compensation parameter in the storage unit. Step 633 for correcting the eddy current gradient magnetic field is the same as in the first embodiment.

Until now, the operation flow of the present embodiment has been described.

As described above, according to the MRI apparatus and the eddy current compensation method of the present embodiment, a plurality of amounts of phase change in each axial direction are calculated by calculating two or more pairs of phase difference images, and the average is set as the final amount of phase change. Therefore, compensation of the compensation parameter and the eddy current magnetic field based on the compensation parameter calculated in this way can be performed more accurately.

Third Embodiment

Next, a third embodiment of the MRI apparatus and the eddy current compensation method of the present invention will be described.

In the present embodiment, it is assumed that an operator can select a compensation direction of the eddy current magnetic field. In addition, an eddy current magnetic field in a direction in which the selected eddy current magnetic field is compensated for is measured, a compensation magnetic field for compensating for the eddy current magnetic field in the direction in which the selected eddy current magnetic field is compensated for is calculated, and the compensation magnetic field in the direction in which the selected eddy current magnetic field is compensated for is generated together with a gradient magnetic field.

Hereinafter, only different parts from each of the above embodiments will be described, and explanation regarding the same parts will be omitted.

Figure 9:
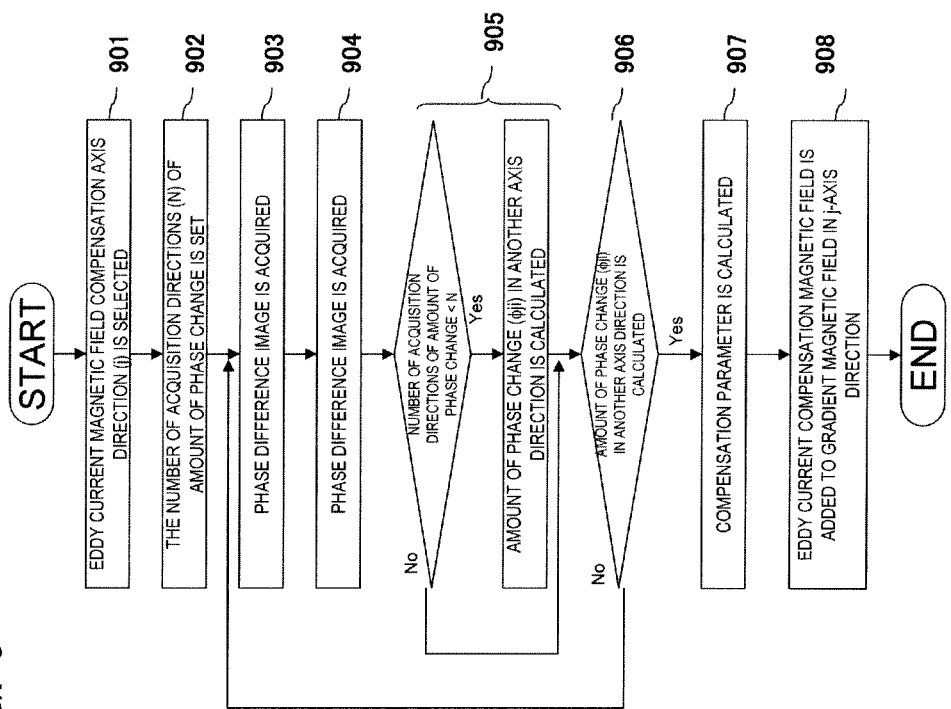
FIG. 9 is a flow chart showing the operation flow of a third embodiment.

The operation flow of the present embodiment will be described on the basis of the flow chart shown in FIG. 9.

In step 901, an operator selects an axial direction (j) for compensation of the eddy current magnetic field using a GUI (not shown).

In step 902, the operator sets the number of acquisition directions (N) of the amount of phase change using the GUI (not shown).

In step 903, the measurement control unit 111 acquires a phase difference image on the basis of the first or second embodiment described above by applying a test gradient magnetic field in an i (i is X, Y, or Z) axis direction.

In step 904, a CPU acquires the phase data in different two points or regions in the axial direction (j), which compensates for the eddy current magnetic field set in step 901, on the phase difference image acquired in step 903, and calculates the amount of phase change ($\phi ji$) in this direction at predetermined time intervals (TR).

In step 905, when the number of acquisition directions (N) of the amount of phase change set in step 902 is larger than 1, the CPU changes the axial direction for acquisition of the amount of phase change, and also acquires the amount of phase change ($\phi*i$) in this direction at predetermined time intervals (TR). In addition, it is assumed that the axial direction for acquisition of the amount of phase change is perpendicular to the direction in which the amount of phase change was already acquired. Then, the CPU repeats this operation until the number of acquisition directions of the amount of phase change becomes equal to N set in step 902.

In step 906, the test gradient magnetic field is applied in all directions, and steps 903 to 905 are repeated by changing the application axis direction of the test gradient magnetic field until the amount of phase change in the axial direction (j) for compensation of the eddy current magnetic field set in step 901 is calculated.

In step 907, for the axial direction in which the amount of phase change has been calculated at predetermined time intervals (TR), the CPU decomposes the amount of phase change in each predetermined time interval (TR) into a plurality of sets of amplitudes (A) and time constants ($\tau$) as in Expression (1) by performing non-linear approximation using the Levenberg-Marquardt method or the like as described above and calculates them as compensation parameters in this axial direction.

In step 908, when executing the subsequent arbitrary pulse sequence, the measurement control unit 111 controls the gradient magnetic field power source to generate a gradient magnetic field, in which a compensation magnetic field for compensating for an eddy current magnetic field based on a gradient magnetic field in each axial direction is added to a gradient magnetic field applied in each axial direction, using the compensation parameter in each axial direction calculated in step 907. In this case, in a direction in which the gradient magnetic field is applied, the gradient magnetic field is output in a state where the compensation magnetic field is added thereto. However, in a direction in which the gradient magnetic field is not applied, only the compensation magnetic field is output.

Until now, the processing flow of the present embodiment has been described.

As described above, according to the MRI apparatus and the eddy current compensation method of the present embodiment, it is possible to compensate for the eddy current magnetic field in the axial direction that the operator wants. As a result, it becomes possible to compensate for the eddy current magnetic field with high accuracy especially in the desired direction. For example, when capturing an image of the blood vessel having a specific direction using a known PC-MRA method or when performing known diffusion tensor imaging for drawing nerve fibers running in a specific direction or the like, it is necessary to eliminate especially the influence of the eddy current magnetic field in the specific direction. In this case, the compensation for the eddy current magnetic field of the present embodiment is effective.

Fourth Embodiment

Next, a fourth embodiment of the MRI apparatus and the eddy current compensation method of the present invention will be described.

In the present embodiment, it is possible to acquire the amount of phase change in all directions by acquiring the phase difference image data as three-dimensional volume data and accordingly, it is possible to compensate for an eddy current magnetic field generated in the arbitrary direction. More specifically, three-dimensional images are reconstructed from echo signals measured by changing the polarity of a test gradient magnetic field, a three-dimensional phase difference image is acquired by calculating the difference between phase images of two three-dimensional images, an eddy current magnetic field is measured on the basis of the phase of a point or a region designated on one of the images, a compensation magnetic field for compensating for the measured eddy current magnetic field is calculated, the calculated compensation magnetic field is distributed in each application direction of the gradient magnetic field, and the compensation magnetic field distributed in each application direction of the gradient magnetic field is generated together with the gradient magnetic field.

Hereinafter, only different parts from each of the above embodiments will be described, and explanation regarding the same parts will be omitted. First, acquiring the phase difference image data as three-dimensional volume data will be described on the basis of FIG. 10. The calibration pulse sequence shown in FIG. 4 is a two-dimensional pulse sequence, but an arbitrary three-dimensional image may also be captured by inserting a known slice encoding gradient magnetic field in the slice direction (Gs) to set a three-dimensional pulse sequence.

Therefore, a positive or negative test gradient magnetic field is applied in one axial direction to capture a three-dimensional image. As a result, the phase difference image data when the test gradient magnetic field is applied in this axial direction is acquired as three-dimensional volume data. Then, by capturing a three-dimensional image with each of the X, Y, and Z axis directions as the application axis direction of the test gradient magnetic field, the phase difference image data in the axial direction in which the test gradient magnetic field is applied is acquired as three-dimensional volume data.

Figure 10:
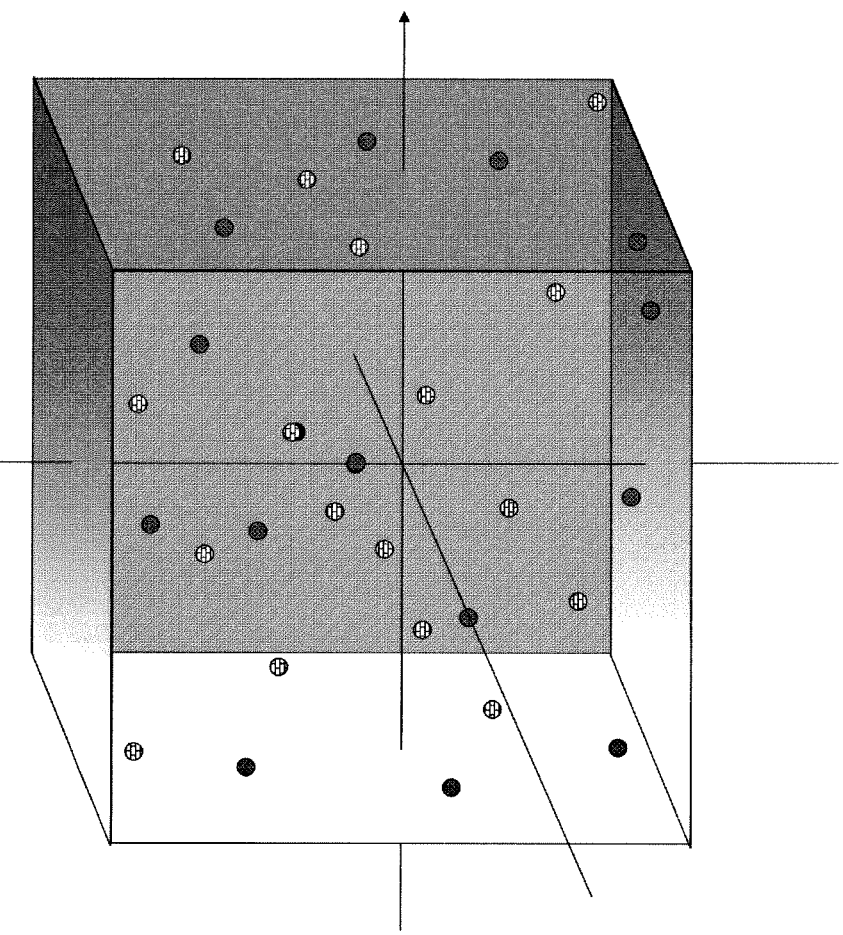
FIG. 10 is a view showing an example of a phase difference image acquired as three-dimensional volume data.

Then, in response to an operator's designation of two arbitrary points or regions in a direction, in which an eddy current magnetic field is compensated for, in the acquired three-dimensional phase difference image, the amount of phase change between these points or regions is calculated. Preferably, by dividing the amount of phase change by the distance between the two points or the two regions and setting it as the amount of phase change per unit length, a compensation parameter for compensating for an eddy current magnetic field generated in a direction connecting these points or regions to each other is calculated. Alternatively, in response to an operator's designation of three points or three regions for specifying a plane, a plane which forms a pair with the plane is acquired. By calculating the amount of phase change between vertices or regions including the vertices on the pair of planes, compensation parameters for compensating for eddy current magnetic fields in three axial directions perpendicular to each other, which are specified at each vertex of the pair of planes, are calculated. In FIG. 10, an ○ mark indicates a point or a region designated by an operator or an auxiliary point or region set by the CPU according to designation of the operator.

In addition, when applying a gradient magnetic field, a compensation magnetic field for compensating for an eddy current magnetic field generated in the direction is generated so as to be superimposed on the applied gradient magnetic field using this compensation parameter. In this case, the compensation magnetic field in the arbitrary direction is decomposed into components in the X, Y, and Z axis directions, and these are superimposed on gradient magnetic fields applied in the X, Y, and Z axis directions, respectively.

Figure 11:
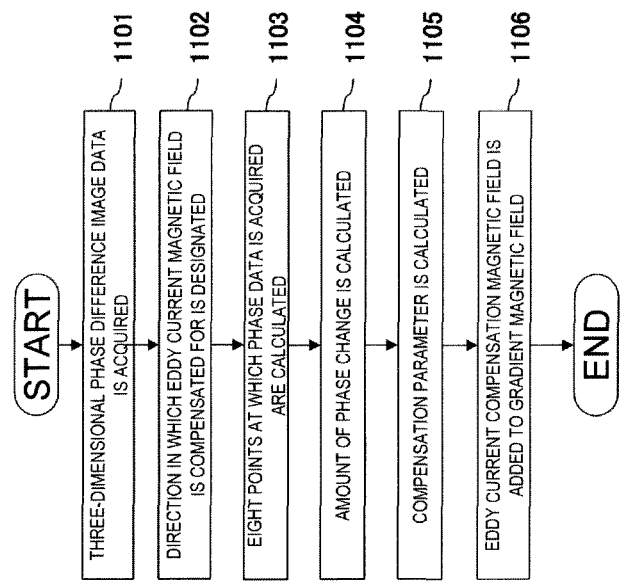
FIG. 11 is a flow chart showing the operation flow of a fourth embodiment.

Next, the operation flow of the present embodiment will be described on the basis of the flow chart shown in FIG. 11. This operation flow is stored in advance as a program in a storage unit, such as a magnetic disk, and is executed when a CPU reads it into the memory to execute it when necessary. Hereinafter, each step will be described in detail.

In step 1101, test gradient magnetic fields are applied in the X, Y, and Z axis directions, and the phase difference image data is acquired as three-dimensional volume data. Specifically, the measurement control unit 111 captures a three-dimensional image by applying a positive or negative test gradient magnetic field in the X-axis direction using the three-dimensional calibration pulse sequence described above. Similarly, the measurement control unit 111 performs three-dimensional imaging by applying a positive or negative test gradient magnetic field in the Y-axis direction and performs three-dimensional imaging by applying a positive or negative test gradient magnetic field in the Z-axis direction. Then, from the two three-dimensional images acquired by applying the test gradient magnetic fields in the X-axis direction, the CPU acquires three-dimensional phase difference image data when the test gradient magnetic field is applied in the X-axis direction. Similarly, the CPU acquires three-dimensional phase difference image data when the test gradient magnetic field is applied in the Y-axis direction from two three-dimensional images acquired by applying the test gradient magnetic fields in the Y-axis direction and acquires three-dimensional phase difference image data when the test gradient magnetic field is applied in the Z-axis direction from two three-dimensional images acquired by applying the test gradient magnetic fields in the Z-axis direction.

In step 1102, the operator designates a direction for compensation for an eddy current magnetic field on a three-dimensional image or a three-dimensional phase difference image in an arbitrary test gradient magnetic field application direction (i) (i=X, Y, Z) using a mouse or the like. Specifically, the operator designates two points or two regions, which indicate a direction in which the eddy current magnetic field is compensated for, on a three-dimensional image or a three-dimensional phase difference image using a mouse or the like.

Figure 12:
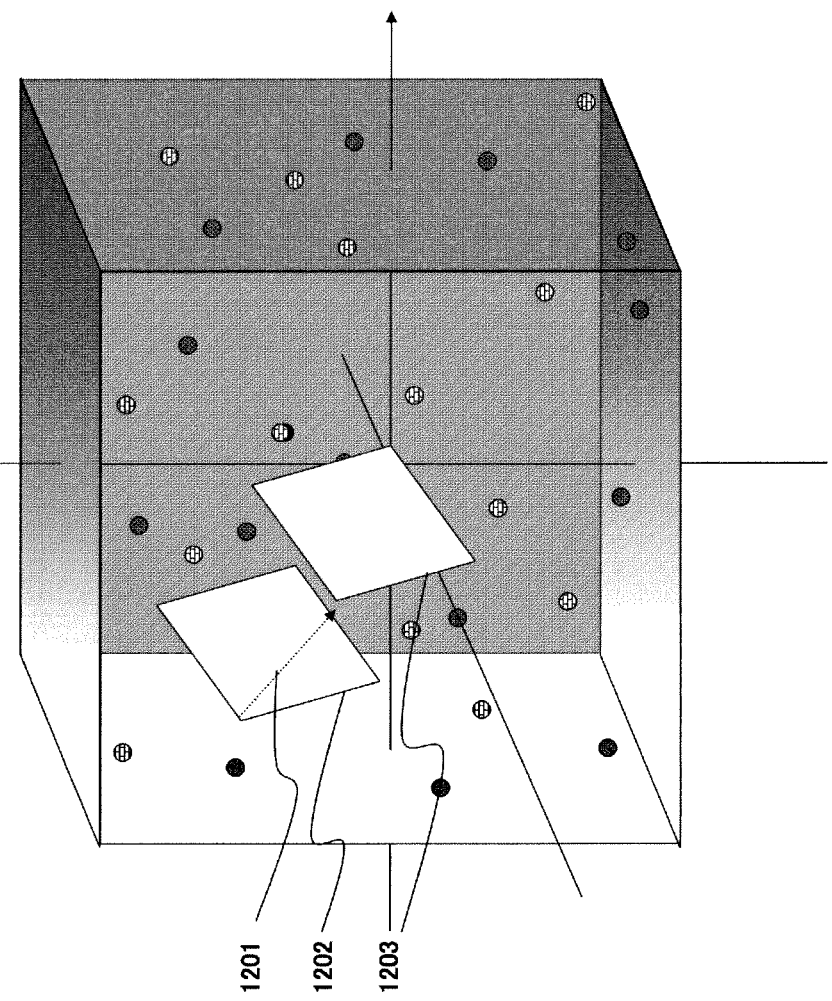
FIG. 12 is a view showing an example of a direction (1201) in which an eddy current magnetic field is compensated for, two rectangular planes (1202, 1203) based on this direction, and eight points of its vertices.

In step 1103, on the basis of the direction designated in step 1102, the CPU sets two rectangular planes which are perpendicular to the direction and are symmetrical with respect to the origin. Then, the CPU sets four vertex positions of each rectangular plane as points or regions in which the phase data is acquired. As a result, eight points or regions in which the phase data is acquired are set. In addition, the CPU also sets these eight points or regions in other three-dimensional phase difference images in the same manner. FIG. 12 shows an example of a direction (1201) in which an eddy current magnetic field is compensated for, two rectangular planes (1202, 1203) based on this direction, and eight points of its vertices.

In step 1104, the CPU acquires the phase data in the eight points or regions set in step 1103 from the three-dimensional phase difference image data, and calculates the amounts of phase change ($\phi ai$, $\phi bi$, $\phi ci$) in a direction (a) perpendicular to the rectangular plane and two directions (b, c) which are parallel to the rectangular plane and are perpendicular to each other. In addition, the CPU calculates the amounts of phase change in these three directions (a, b, c) every three-dimensional phase difference image in each test gradient magnetic field application direction (X, Y, Z). Accordingly, the amount of phase change ($\phi ax$, $\phi bx$, $\phi cx$) is calculated from the three-dimensional phase difference image data acquired by applying a test gradient magnetic field in the X-axis direction, the amount of phase change ($\phi ay$, $\phi by$, $\phi cy$) is calculated from the three-dimensional phase difference image data acquired by applying a test gradient magnetic field in the Y-axis direction, and the amount of phase change ($\phi az$, $\phi bz$, $\phi cz$) is calculated from the three-dimensional phase difference image data acquired by applying a test gradient magnetic field in the Z-axis direction.

In step 1105, the CPU calculates compensation parameters of the three directions (a, b, c) using the amounts of phase change calculated in step 1104. Moreover, for a compensation parameter to be transformed into the (X, Y, Z) coordinate system, which is a gradient magnetic field coordinate system, among the compensation parameters, the compensation parameter is transformed into the (X, Y, Z) coordinate system and the value after coordinate transformation is added in each direction (X, Y, Z). For example, a compensation parameter corresponding to the amplitude (A) in Expression (1) is a compensation parameter to be transformed into the (X, Y, Z) coordinate system, but the time constant ($\tau$) is used as it is for the amplitude (A) transformed into the (X, Y, Z) coordinate system. Finally, the CPU stores compensation parameters including the time constant ($\tau$) and the amplitude (A) transformed into the (X, Y, Z) coordinate system in a storage unit.

In step 1106, when the measurement control unit 111 applies a gradient magnetic field, the CPU reads the compensation parameters calculated in step 1105 from the storage unit and notifies the measurement control unit 111 of them. On the basis of these compensation parameters, the measurement control unit 111 controls the gradient magnetic field power source to generate a gradient magnetic field in which a compensation magnetic field for compensating for an eddy current magnetic field based on this gradient magnetic field is added.

Until now, the operation flow of the present embodiment has been described.

As described above, according to the MRI apparatus and the eddy current compensation method of the present embodiment, it becomes possible to compensate for an eddy current magnetic field in an arbitrary direction. As a result, it becomes possible to compensate for the eddy current magnetic field with high accuracy especially in the desired direction by an operator's selection. Specific usefulness is the same as in the third embodiment.

REFERENCE SIGNS LIST

101: subject
102: static magnetic field generation magnet
103: gradient coil
104: transmission RF coil
105: receiving RF coil
106: signal detection unit
107: signal processing unit
108: overall control unit
109: gradient magnetic field power source
110: RF transmission unit
111: measurement control unit
112: bed
113: display and operation unit

The invention claimed is:

1. A magnetic resonance imaging apparatus comprising:
a gradient magnetic field generating unit that generates an arbitrary gradient magnetic field;
an eddy current magnetic field measuring unit that measures an eddy current magnetic field based on an eddy current, which is generated according to application of a test gradient magnetic field, through a phase of an image; and a compensation magnetic field calculating unit that calculates a compensation magnetic field, which is for compensating for an eddy current magnetic field according to application of the arbitrary gradient magnetic field, on the basis of the measured eddy current magnetic field, wherein the gradient magnetic field generating unit generates the compensation magnetic field in addition to the arbitrary gradient magnetic field, wherein the eddy current magnetic field measuring unit reconstructs three-dimensional images from echo signals measured by changing a polarity of the test gradient magnetic field, acquires a three-dimensional phase difference image by calculating a difference between phase images of two three-dimensional images, and measures the eddy current magnetic field generated in each direction amongst an application direction of the test gradient magnetic field and another direction which is different from the application direction, on the basis of a difference between phases in two points or regions in each of said application direction and said another direction, in a pair of planes in the three-dimensional phase difference image, the compensation magnetic field calculating unit calculates the compensation magnetic field, which compensates for the eddy current magnetic field according to the application of the arbitrary gradient magnetic field, and distributes the calculated compensation magnetic field in each application direction of the gradient magnetic field, on the basis of the measured eddy current magnetic field in said each direction, and the gradient magnetic field generating unit generates the calculated compensation magnetic field distributed in said each application direction of the gradient magnetic field, together with the arbitrary gradient magnetic field.

2. The magnetic resonance imaging apparatus according to claim 1, wherein the compensation magnetic field calculating unit calculates a plurality of compensation parameters specifying the compensation magnetic field, and the gradient magnetic field generating unit generates the compensation magnetic field on the basis of the plurality of compensation parameters.

3. A magnetic resonance imaging apparatus comprising:

a gradient magnetic field generating unit that generates a gradient magnetic field;

a measurement control unit that controls the gradient magnetic field generating unit to apply to a subject a gradient magnetic field specified in a predetermined pulse sequence and controls measurement of an echo signal from the subject; and an arithmetic processing unit that performs arithmetic processing of the echo signal to reconstruct an image of the subject, wherein the measurement control unit makes the gradient magnetic field generating unit generate a compensation magnetic field, which compensates for an eddy current magnetic field based on an eddy current generated according to application of the gradient magnetic field, together with the gradient magnetic field, the arithmetic processing unit reconstructs a phase image using an echo signal measured by application of a test gradient magnetic field, calculates eddy current magnetic fields generated in an application direction of the test gradient magnetic field and a direction different from the application direction on the basis of the phase image, and calculates a compensation magnetic field, which compensates for an eddy current magnetic field according to application of an arbitrary gradient magnetic field in each direction, on the basis of the calculated eddy current magnetic field in each direction, and the measurement control unit controls the gradient magnetic field generating unit to generate the calculated compensation magnetic field in each direction together with the arbitrary gradient magnetic field, and wherein the measurement control unit reconstructs three-dimensional images from echo signals measured by changing a polarity of the gradient magnetic field, acquires a three-dimensional phase difference image by calculating a difference between phase images of two three-dimensional images, and measures the eddy current magnetic field generated in each direction amongst an application direction of the gradient magnetic field and another direction which is different from the application direction, on the basis of a difference between phases in two points or regions in each of said application direction and said another direction, in a pair of planes in the three-dimensional phase difference image, the measurement control unit calculates the compensation magnetic field, which compensates for the eddy current magnetic field according to the application of the arbitrary gradient magnetic field, and distributes the calculated compensation magnetic field in each application direction of the gradient magnetic field, on the basis of the measured eddy current magnetic field in said each direction, and the gradient magnetic field generating unit generates the calculated compensation magnetic field distributed in said each application direction of the gradient magnetic field, together with the arbitrary gradient magnetic field.

4. A magnetic resonance imaging apparatus comprising:

a gradient magnetic field generating unit that generates an arbitrary gradient magnetic field;

an eddy current magnetic field measuring unit that measures an eddy current magnetic field based on an eddy current, which is generated according to application of a test gradient magnetic field, through a phase of an image; and a compensation magnetic field calculating unit that calculates a compensation magnetic field, which is for compensating for an eddy current magnetic field according to application of the arbitrary gradient magnetic field, on the basis of the measured eddy current magnetic field, wherein the gradient magnetic field generating unit generates the compensation magnetic field in addition to the arbitrary gradient magnetic field, wherein the eddy current magnetic field measuring unit reconstructs three-dimensional images from echo signals measured by changing a polarity of the test gradient magnetic field, acquires a three-dimensional phase difference image by calculating a difference between phase images of two three-dimensional images, and measures the eddy current magnetic field generated in each direction amongst an application direction of the test gradient magnetic field and another direction which is different from the application direction, on the basis of a difference between phases in two points or regions in each of said application direction and said another direction, in a pair of planes in the three-dimensional phase difference image, the compensation magnetic field calculating unit calculates the compensation magnetic field in each application direction of the gradient magnetic field, which compensates for the eddy current magnetic field according to the application of the arbitrary gradient magnetic field, on the basis of the measured eddy current magnetic field in said each direction, and the gradient magnetic field generating unit generates the calculated compensation magnetic field distributed in said each application direction of the gradient magnetic field, together with the arbitrary gradient magnetic field.

5. A magnetic resonance imaging apparatus comprising:

a gradient magnetic field generating unit that generates an arbitrary gradient magnetic field;

an eddy current magnetic field measuring unit that measures an eddy current magnetic field based on an eddy current, which is generated according to application of a test gradient magnetic field, through a phase of an image; and a compensation magnetic field calculating unit that calculates a compensation magnetic field, which is for compensating for an eddy current magnetic field according to application of the arbitrary gradient magnetic field, on the basis of the measured eddy current magnetic field, wherein the gradient magnetic field generating unit generates the compensation magnetic field in addition to the arbitrary gradient magnetic field, the eddy current magnetic field measuring unit measures the eddy current magnetic field generated in each direction amongst an application direction of the test gradient magnetic field and another direction which is different from the application direction, on the basis of a difference between phases in two points or regions in each of said application direction and said another direction, in a pair of phase images which shows a phase change occurring due to the application of the test gradient magnetic field, the compensation magnetic field calculating unit calculates the compensation magnetic field, which compensates for the eddy current magnetic field according to the application of the arbitrary gradient magnetic field, on the basis of the measured eddy current magnetic field in said each direction, and the gradient magnetic field generating unit generates the calculated compensation magnetic field in said each application direction, together with the arbitrary gradient magnetic field.

6. The magnetic resonance imaging apparatus according to claim 5, wherein on the basis of echo signals measured at a pair of slice positions perpendicular to a predetermined one direction, the eddy current magnetic field measuring unit measures eddy current magnetic fields in the predetermined one direction and a direction perpendicular to the predetermined one direction.

7. The magnetic resonance imaging apparatus according to claim 6, wherein the eddy current magnetic field measuring unit measures the eddy current magnetic fields in the predetermined one direction and a direction perpendicular to the predetermined one direction by measuring the echo signals by applying the test gradient magnetic field in the predetermined one direction, reconstructing a phase image, which shows a phase change occurring due to application of the test gradient magnetic field, at each of the slice positions on the basis of the echo signals, and acquiring the amounts of phase change in the predetermined one direction and the direction perpendicular to the predetermined one direction on a pair of phase images.

8. The magnetic resonance imaging apparatus according to claim 7, wherein the eddy current magnetic field measuring unit measures the eddy current magnetic field in each direction by applying a test gradient magnetic field in a first axial direction and acquiring the amounts of phase change in the first direction and second and third directions which are perpendicular to the first direction and are perpendicular to each other.

9. The magnetic resonance imaging apparatus according to claim 7, wherein the eddy current magnetic field measuring unit reconstructs each phase image from echo signals measured by changing the polarity of the test gradient magnetic field and acquires the amount of phase change on a pair of phase difference images acquired by calculating a difference between two phase images at the same slice position.

10. The magnetic resonance imaging apparatus according to claim 6, wherein the eddy current magnetic field measuring unit measures echo signals of the pair of slice positions in the predetermined one direction and symmetrically with respect to an origin or a coordinate plane which includes the origin and is perpendicular to the predetermined one direction.

11. The magnetic resonance imaging apparatus according to claim 7, wherein the eddy current magnetic field measuring unit acquires the amount of phase change using a phase of each vertex of a rectangular shape, which has sides in a direction perpendicular to the predetermined one direction, or a phase of a region including the vertex on the phase difference image.

12. The magnetic resonance imaging apparatus according to claim 11, wherein the eddy current magnetic field measuring unit sets the rectangular shapes with different sizes on the phase difference image acquired at each of two or more pairs of slice positions perpendicular to the predetermined one direction and acquires the amount of phase change using a phase of each vertex of the rectangular shape or a phase of a region including the vertex.

13. The magnetic resonance imaging apparatus according to claim 5, wherein the eddy current magnetic field measuring unit measures an eddy current magnetic field in a direction in which a selected eddy current magnetic field is compensated for, the compensation magnetic field calculating unit calculates a compensation magnetic field for compensating for an eddy current magnetic field in the direction in which the selected eddy current magnetic field is compensated for, and the gradient magnetic field generating unit generates a compensation magnetic field in the direction, in which the selected eddy current magnetic field is compensated for, together with the gradient magnetic field.

* * * * *